US012046626B2

(12) United States Patent
Lee et al.

(10) Patent No.: US 12,046,626 B2
(45) Date of Patent: Jul. 23, 2024

(54) DISPLAY APPARATUS AND METHOD FOR MANUFACTURING SAME

(71) Applicant: SAMSUNG DISPLAY CO., LTD., Yongin-si (KR)

(72) Inventors: Hee Keun Lee, Yongin-si (KR); Tae Jin Kong, Yongin-si (KR); Veidhes Basrur, Yongin-si (KR); Xinxing Li, Yongin-si (KR); Chang Il Tae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 535 days.

(21) Appl. No.: 17/281,856

(22) PCT Filed: Apr. 1, 2019

(86) PCT No.: PCT/KR2019/003800
§ 371 (c)(1),
(2) Date: Mar. 31, 2021

(87) PCT Pub. No.: WO2020/071599
PCT Pub. Date: Apr. 9, 2020

(65) Prior Publication Data
US 2021/0384252 A1 Dec. 9, 2021

(30) Foreign Application Priority Data
Oct. 1, 2018 (KR) .................. 10-2018-0117182

(51) Int. Cl.
*H01L 27/15* (2006.01)
*H01L 33/00* (2010.01)
(Continued)

(52) U.S. Cl.
CPC .......... *H01L 27/156* (2013.01); *H01L 33/005* (2013.01); *H01L 33/24* (2013.01);
(Continued)

(58) Field of Classification Search
CPC ..... H01L 27/156; H01L 33/005; H01L 33/24; H01L 33/38; H01L 33/44; H01L 33/62;
(Continued)

(56) References Cited

U.S. PATENT DOCUMENTS 9,570,425 B2   2/2017 Do
9,570,529 B2   2/2017 Lhee
(Continued)

FOREIGN PATENT DOCUMENTS

CN   203026503   6/2013
CN   105378552   3/2016
(Continued)

OTHER PUBLICATIONS

International Search Report, with English translation, corresponding to International Application No. PCT/KR2019/003800 dated Jul. 5, 2019.
(Continued)

*Primary Examiner* — Douglas W Owens
(74) *Attorney, Agent, or Firm* — KILE PARK REED & HOUTTEMAN PLLC

(57) ABSTRACT

A display device may include a substrate including a display area and a non-display area, and pixels provided on the display area. Each pixel includes sub-pixels each including an emission area and a non-emission area. Each of the sub-pixels may include a display element layer including at least one light emitting element that emits light. The display element layer may include a first electrode and a second electrode spaced apart from each other with the light emitting element disposed therebetween, connection lines including a first connection line extending in a row direction of the substrate and electrically connected to the first electrode, and a second connection line extending parallel to the first connection line and connected to the second electrode.
(Continued)

Two connection lines having a symmetric structure may be disposed in an area between two sub-pixels adjacent to each other in a column direction of the substrate.

20 Claims, 18 Drawing Sheets

(51) Int. Cl.
  *H01L 33/24* (2010.01)
  *H01L 33/38* (2010.01)
  *H01L 33/44* (2010.01)
  *H01L 33/62* (2010.01)

(52) U.S. Cl.
  CPC .............. *H01L 33/38* (2013.01); *H01L 33/44* (2013.01); *H01L 33/62* (2013.01); *H01L 2933/0016* (2013.01)

(58) Field of Classification Search
  CPC ......... H01L 2933/0016; H01L 29/7869; H01L 25/0753; H01L 27/1214; H01L 33/36
  See application file for complete search history.

(56) References Cited

U.S. PATENT DOCUMENTS

| | | | |
|---|---|---|---|
| 9,978,725 | B2 | 5/2018 | Do |
| 10,026,777 | B2 | 7/2018 | Kang et al. |
| 10,249,603 | B2 | 4/2019 | Cho et al. |
| 10,461,123 | B2 * | 10/2019 | Kim ..................... H01L 33/385 |
| 10,672,946 | B2 | 6/2020 | Cho et al. |
| 10,818,647 | B2 | 10/2020 | Kim et al. |
| 10,818,820 | B2 | 10/2020 | Kim |
| 2017/0033166 | A1 | 2/2017 | Shim et al. |
| 2018/0019369 | A1 | 1/2018 | Cho et al. |
| 2018/0175104 | A1 | 6/2018 | Kang et al. |
| 2018/0175106 | A1 | 6/2018 | Kim et al. |

FOREIGN PATENT DOCUMENTS

| | | |
|---|---|---|
| CN | 107509284 | 12/2017 |
| CN | 107611153 | 1/2018 |
| CN | 108206228 | 6/2018 |
| JP | 2010-122355 | 6/2010 |
| JP | 2014-75550 | 4/2014 |
| JP | 2016-70954 | 5/2016 |
| KR | 10-1212225 | 12/2012 |
| KR | 10-1429095 | 8/2014 |
| KR | 10-2017-0015637 | 2/2017 |
| KR | 10-2018-0007025 | 1/2018 |
| KR | 10-2018-0047540 | 5/2018 |
| KR | 10-2018-0057777 | 5/2018 |
| KR | 10-2018-0071465 | 6/2018 |
| KR | 10-2018-0072909 | 7/2018 |
| KR | 10-2019-0120467 | 10/2019 |

OTHER PUBLICATIONS

Written Opinion, with English translation, corresponding to International Application No. PCT/KR2019/003800, dated Jul. 5, 2019.
European Office Action for European Patent Application No. 19 869 683.3, dated May 9, 2023.
Notice of Allowance for Korean Patent Application or Patent No. 10-2018-0117182, dated Jan. 11, 2024.

* cited by examiner

DISPLAY APPARATUS AND METHOD FOR MANUFACTURING SAME

CROSS-REFERENCE TO RELATED APPLICATION(S)

This application is a national entry of International Application No. PCT/KR2019/003800, filed on Apr. 1, 2019, which claims under 35 U.S.C. §§ 119(a) and 365(b) priority to and benefits of Korean Patent Application No. 10-2018-0117182, filed on Oct. 1, 2018 in the Korean Intellectual Property Office (KIPO), the entire contents of which are incorporated herein by reference.

BACKGROUND

1. Technical Field

Various embodiments of the disclosure relate to a display device and a method of fabricating the display device.

2. Description of Related Art

A light emitting diode (hereinafter, referred to as "LED") may have relatively satisfactory durability even under poor environmental conditions and have excellent performances in terms of lifetime and luminance.

To apply the LED to a lighting device, a display device, or the like, there is a need to connect the LED to an electrode so that the voltage of the power supply may be applied to the LED. With regard to application purposes of the LED, a method of reducing space needed for the electrode, or a method of fabricating the LED, various research on arrangement relationship between the LED and the electrode have been conducted.

SUMMARY

Various embodiments of the disclosure are directed to a display device capable of minimizing misalignment of a subminiature light emitting diode and thus enhancing the light output efficiency of the light emitting diode, and a method of fabricating the display device.

A display device in accordance with an embodiment of the disclosure may include a substrate including a display area and a non-display area; and a plurality of pixels provided on the display area, each of the plurality of pixels comprising a plurality of sub-pixels each including an emission area and a non-emission area. Each of the plurality of sub-pixels may include a display element layer including at least one light emitting element that emits light. The display element layer may include a first electrode and a second electrode spaced apart from each other, the at least one light emitting element being disposed between the first and second electrodes; and connection lines comprising a first connection line extending in a row direction of the substrate and electrically connected to the first electrode, and a second connection line extending parallel the first connection line and electrically connected to the second electrode. Two connection lines having a symmetric structure may be disposed in an area between two sub-pixels of the plurality of sub-pixels adjacent to each other in a column direction of the substrate.

In an embodiment of the disclosure, the area between the two sub-pixels may be the non-emission area. The two connection lines may form a mirror symmetric structure with respect to an imaginary line extending in the row direction in the area between the two sub-pixels.

In an embodiment of the disclosure, the two connection lines may include the first connection line provided in one of the two sub-pixels and electrically connected to the first electrode of the one of the two sub-pixels; and the first connection line provided in the other of the two sub-pixels and electrically connected to the first electrode of the other of the two sub-pixels.

In an embodiment of the disclosure, the second electrode of each of the two sub-pixels may include a 2-1th electrode and a 2-2th electrode that diverge from the second connection line of corresponding one of the two sub-pixels into the emission area of the corresponding one of the two sub-pixels. The 2-1th electrode and the 2-2th electrode may be spaced apart from each other. The first electrode of the corresponding one of the two sub-pixels may be disposed between the 2-1th electrode and the 2-2th electrode.

In an embodiment of the disclosure, the first electrode of each of the two sub-pixels may include a 1-1th electrode and a 1-2th electrode that diverge from the first connection line of corresponding one of the two sub-pixels into the emission area of the corresponding one of the two sub-pixels. The 1-1th electrode and the 1-2th electrode may be spaced apart from each other. The second electrode of the corresponding one of the two sub-pixels may be disposed between the 1-1th electrode and the 1-2th electrode.

In an embodiment of the disclosure, the second connection line of one of the two sub-pixels may be disposed at an upper side of the first connection line in the column direction in the one of the two sub-pixels. The second connection line of the other of the two sub-pixels may be disposed at a lower side of the first connection line in the column direction the one of the two sub-pixels.

In an embodiment of the disclosure, the second connection line of each of the two sub-pixels may be spaced apart from each other. The emission area of each of the two sub-pixels may be disposed between the second connection line of each of the two sub-pixels in the column direction.

In an embodiment of the disclosure, the second electrode of one of the two sub-pixels may include a 2-1th electrode, a 2-2th electrode, and a 2-3th electrode that diverge from the second connection line of the one or the two sub-pixels into the emission area of the one of the two sub-pixels. The 2-1th electrode and the 2-2th electrode may be spaced apart from each other. The 1-1th electrode may be disposed between the 2-1th electrode and the 2-2th electrode. The 2-2th electrode and the 2-3th electrode may be spaced apart from each other. The 1-2th electrode may be disposed between the 2-2th electrode and the 2-3th electrode.

In an embodiment of the disclosure, the two connection lines may include the second connection line provided in one of the two sub-pixels and electrically connected to the second electrode of the one of the tow sub-pixels; and the second connection line provided in the other of the two sub-pixels and electrically connected to the second electrode of the other of the two sub-pixels.

In an embodiment of the disclosure, the first electrode of each of the two sub-pixels may include a 1-1th electrode and a 1-2th electrode that diverge from the first connection line of corresponding one of the two sub-pixels into the emission area of the corresponding one of the two sub-pixels. The 1-1th electrode and the 1-2th electrode may be spaced apart from each other. The second electrode of the corresponding one of the two sub-pixels may be disposed between the 1-1th electrode and the 1-2th electrode.

In an embodiment of the disclosure, the second electrode of each of the two sub-pixels may include a 2-1th electrode and a 2-2th electrode that diverge from the second connection line of corresponding one of the two sub-pixels into the emission area of the corresponding one or the two sub-pixels. The 2-1th electrode and the 2-2th electrode may be spaced apart from each other. The first electrode of the corresponding one of the two sub-pixels may be disposed between the 2-1th electrode and the 2-2th electrode.

In an embodiment of the disclosure, the first connection line of one of the two sub-pixels may be disposed above the second connection line in the column direction in the one of the two sub-pixels. The first connection line of the other of the two sub-pixels may be disposed below the second connection line in the column direction in the other of the two sub-pixels.

In an embodiment of the disclosure, the first connection line of each of the two sub-pixels may be spaced apart from each other. The emission area of each of the two sub-pixels may be disposed between the first connection line of each of the two sub-pixels in the column direction.

In an embodiment of the disclosure, the first electrode of each of the two sub-pixels may include a 1-1th electrode, a 1-2th electrode, and a 1-3th electrode that diverge from the first connection line of corresponding one of the two sub-pixels into the emission area of the corresponding one of the two sub-pixels. The 1-1th electrode and the 1-2th electrode may be spaced apart from each other. The 2-1th electrode may be disposed between the 1-1th electrode and the 1-2th electrode. The 1-2th electrode and the 1-3th electrode may be spaced apart from each other. The 2-2th electrode may be disposed between the 1-2th electrode and the 1-3th electrode.

In an embodiment of the disclosure, the display element layer may include a first contact electrode that electrically connects the first electrode with one end of the at least one light emitting element; and a second contact electrode that electrically connects the second electrode with another end of the light emitting element.

In an embodiment of the disclosure, each of the plurality of sub-pixels may include a pixel circuit layer including at least one transistor electrically connected to the at least one light emitting element.

The above-described display device may be fabricated by a method including providing a substrate on which a plurality of sub-pixels each including an emission area and a non-emission area are to be disposed; and forming, on the substrate, a display element layer that emits light from the emission area of each of the plurality of sub-pixels.

In an embodiment of the disclosure, the forming of the display element layer may include forming a first electrode and a second electrode spaced apart from each other in the emission area of each of the plurality of sub-pixels, forming, in the non-emission area of each of the plurality of sub-pixels, first metal layers electrically connected to the first electrode and extending in a direction, and second metal layers electrically connected to the second electrode and extending parallel to the first metal layer; forming an electric field between the first electrode and the second electrode by applying different voltages to the first metal layers and the second metal layers, and aligning a plurality of light emitting elements between the first electrode and the second electrode; forming, on the substrate including the plurality of light emitting elements, connection lines by removing a portion of one of the first and the second metal layers, the connection lines including a first connection line electrically connected to the first electrode and a second connection line electrically connected to the second electrode; forming a first contact electrode that electrically connects the first electrode with one end of each of the plurality of light emitting elements; and forming a second contact electrode that electrically connects the second electrode with another end of the opposite ends of each of the light emitting elements.

In an embodiment of the disclosure, the aligning of the plurality of light emitting elements may include disposing two metal layers formed on a same layer and to which an identical voltage is to be applied in an area between two sub-pixels of each of the plurality of sub-pixels disposed adjacent to each other in a column direction of the substrate.

In an embodiment of the disclosure, the area between the two sub-pixels may be the non-emission area. The method may further include after the aligning of the plurality of light emitting elements, disposing two connection lines having a mirror symmetric structure with respect to an imaginary line extending in a row direction intersecting the column direction in the area between the two sub-pixels. The forming of the first and second electrodes and the forming of the first and second metal layers may be performed simultaneously.

In an embodiment of the disclosure, the two metal layers to which the identical alignment voltage is to be applied may include the first metal layer provided in one of the two sub-pixels and electrically connected to the first electrode of the one of the two sub-pixels; and the first metal layer provided in the other of the two sub-pixels and electrically connected to the first electrode of the other of the two sub-pixels.

In an embodiment of the disclosure, the two metal layers to which the identical alignment voltage is to be applied may include the second metal layer in one of the two sub-pixels and electrically connected to the second electrode of the one of the two sub-pixels; and the second metal layer provided in the other of the two sub-pixels and electrically connected to the second electrode of the other of the two sub-pixels.

Various embodiments of the disclosure may provide a display device, and a method of fabricating the display device in which a light emitting element is disposed only in a target area so that the optical efficiency of the light emitting element can be enhanced.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1A:
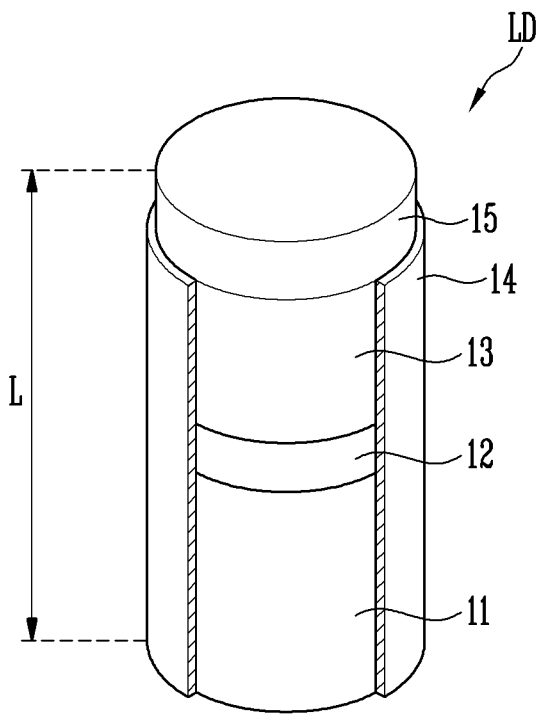
FIGS. 1A and 1B each are a schematic perspective diagram illustrating a light emitting element in accordance with an embodiment of the disclosure.

As the disclosure allows for various changes and numerous embodiments, some embodiments will be illustrated in the drawings and described in detail in the disclosure. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise," "include," "have," and the like when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be directly on the second part or a third part may intervene between them. When it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be directly under the second part or a third part may intervene between them.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined herein.

Embodiments of the disclosure will hereinafter be described in detail with reference to the accompanying drawings.

Figure 1B:
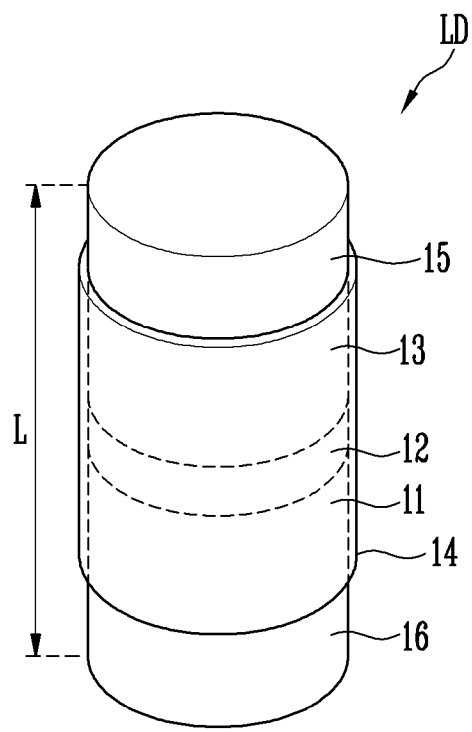

FIGS. 1A and 1B are perspective views illustrating various types of light emitting elements in accordance with embodiments of the disclosure. Although FIGS. 1A and 1B illustrate cylindrical light emitting elements, the disclosure is not limited thereto.

Referring to FIGS. 1A and 1B, a light emitting element LD in accordance with an embodiment of the disclosure may include a first semiconductor layer (or a first conductive semiconductor layer) 11, a second semiconductor layer (or a second conductive semiconductor layer) 13, and an active layer 12 interposed between the first and second conductive semiconductor layers 11 and 13. For example, the light emitting element LD may include a stacked body formed by successively stacking the first conductive semiconductor layer 11, the active layer 12, and the second conductive semiconductor layer 13.

In an embodiment of the disclosure, the light emitting element LD may have a rod-like shape extending in a direction. If the direction in which the light emitting element LD extends is defined as a longitudinal direction, the light emitting element LD may have a first end and a second end in the longitudinal direction. One of the first and second conductive semiconductor layers 11 and 13 may be disposed on the first end, and the other of the first and second conductive semiconductor layers 11 and 13 may be disposed on the second end.

Although the light emitting element LD may have a form of a cylinder, the disclosure is not limited thereto. The light emitting element LD may have a rod-like shape or a bar-like shape extending in the longitudinal direction (i.e., having an aspect ratio greater than 1). For example, a length L of the light emitting element LD in the longitudinal direction may be greater than the diameter thereof. The light emitting element LD may include a light emitting diode fabricated in a subminiature size having a diameter and/or length corresponding to, e.g., a microscale or nanoscale size.

However, the size of the light emitting element LD is not limited thereto, and the size of the light emitting element LD may be changed to meet requirements of a lighting device or a self-emissive display device to which the light emitting element LD is applied.

The first conductive semiconductor layer 11 may include, for example, at least one n-type semiconductor layer. For instance, the first conductive semiconductor layer 11 may include a semiconductor layer which includes any one semiconductor material of InAlGaN, GaN, AlGaN, InGaN, AlN, and InN, and is doped with a first conductive dopant such as Si, Ge, or Sn. The material forming the first conductive semiconductor layer 11 is not limited thereto, and the first conductive semiconductor layer 11 may be formed of or include various other materials.

The active layer 12 may be formed on the first conductive semiconductor layer 11 and have a single or multiple quantum well structure. In an embodiment of the present disclosure, a cladding layer (not illustrated) doped with a conductive dopant may be formed on and/or under the active layer 12. For example, the cladding layer may be formed of or include an AlGaN layer or an InAlGaN layer. A material such as AlGaN or AlInGaN may be employed to form the active layer 12.

If an electric field having a predetermined voltage or more is applied to the opposite ends of the light emitting element LD, the light emitting element LD emits light by recombining of electron-hole pairs in the active layer 12.

The second conductive semiconductor layer 13 may be provided on the active layer 12 and include a semiconductor layer of a type different from that of the first conductive semiconductor layer 11. For example, the second conductive semiconductor layer 13 may include at least one p-type semiconductor layer. For instance, the second conductive semiconductor layer 13 may include a semiconductor layer which includes any one semiconductor material of InAlGaN, GaN, AlGaN, InGaN, AlN, and InN, and is doped with a second conductive dopant such as Mg. The material forming the second conductive semiconductor layer 13 is not limited thereto, and the second conductive semiconductor layer 13 may be formed of or include various other materials.

In an embodiment of the disclosure, the light emitting element LD may further include an electrode layer 15 disposed on the second conductive semiconductor layer 13, as illustrated in FIG. 1A, as well as including the first conductive semiconductor layer 11, the active layer 12, and the second conductive semiconductor layer 13. Furthermore, in an embodiment, as shown in FIG. 1B, the light emitting element LD may further include another electrode layer 16 disposed on an end of the first conductive semiconductor layer 11 as well as including the electrode layer 15.

Although each of the electrode layers 15 and 16 may be formed of an ohmic contact electrode, the disclosure is not limited thereto. The electrode layers 15 and 16 may include metal or a metal oxide. For example, chrome (Cr), titanium (Ti), aluminum (Al), gold (Au), nickel (Ni), ITO, and an oxide or alloy thereof may be used alone or in combination with each other. However, the disclosure is not limited thereto.

Materials included in the respective electrode layers 15 and 16 may be to the same or different from each other. The electrode layers 15 and 16 may be substantially transparent or semitransparent. Therefore, light generated from the light emitting element LD may pass through the electrode layers 15 and 16 and then be emitted outside the light emitting element LD.

In an embodiment of the disclosure, the light emitting element LD may further include an insulating film 14. However, in some embodiments of the disclosure, the insulating film 14 may be omitted, or may to cover or overlap at least one of the first conductive semiconductor layer 11, the active layer 12, and the second conductive semiconductor layer 13.

As illustrated in FIG. TA, the insulating film 14 may be provided on a portion of the light emitting element LD other than one of opposite ends of the light emitting element LD. In this case, the insulating film 14 may expose only the electrode layer 15 disposed on an end of the second conductive semiconductor layer 13 of the light emitting element LD and enclose the overall side surfaces of the components other than the electrode layer 15. Here, the insulating film 14 may allow at least the opposite ends of the light emitting element LD to be exposed to the outside. For example, the insulating film 14 may allow not only the electrode layer 15 disposed on an end of the second conductive semiconductor layer 13 but also an end of the first conductive semiconductor layer 11 to be exposed to the outside.

In an embodiment, as illustrated in FIG. 1B, in the case where the electrode layers 15 and 16 are disposed on the respective opposite ends of the light emitting element LD, the insulating film 14 may allow at least one area of each of the electrode layers 15 and 16 to be exposed to the outside. As another example, in an embodiment, the insulating film 14 may not be provided.

In an embodiment of the disclosure, the insulating film 14 may include transparent insulating material. For example, the insulating film 14 may include at least one insulating material selected from the group consisting of $SiO_2$, $Si_3N_4$, $Al_2O_3$, and $TiO_2$, but it is not limited thereto. In other words, various materials having insulating properties may be employed.

If the insulating film 14 is provided on the light emitting element LD, the active layer 12 may be prevented from short-circuiting with a first electrode and/or a second electrode, which area not illustrated. Thanks to the insulating film 14, occurrence of a defect on the surface of the light emitting element LD may be reduced or minimized, whereby the lifetime and efficiency of the light emitting element LD may be improved. In the case where light emitting elements LD are disposed close to each other, the insulating film 14 may prevent an undesired short-circuit from occurring between the light emitting elements LD.

The light emitting element LD may be employed as a light source for various display devices. The light emitting element LD may be fabricated through a surface treatment process.

Figure 2:
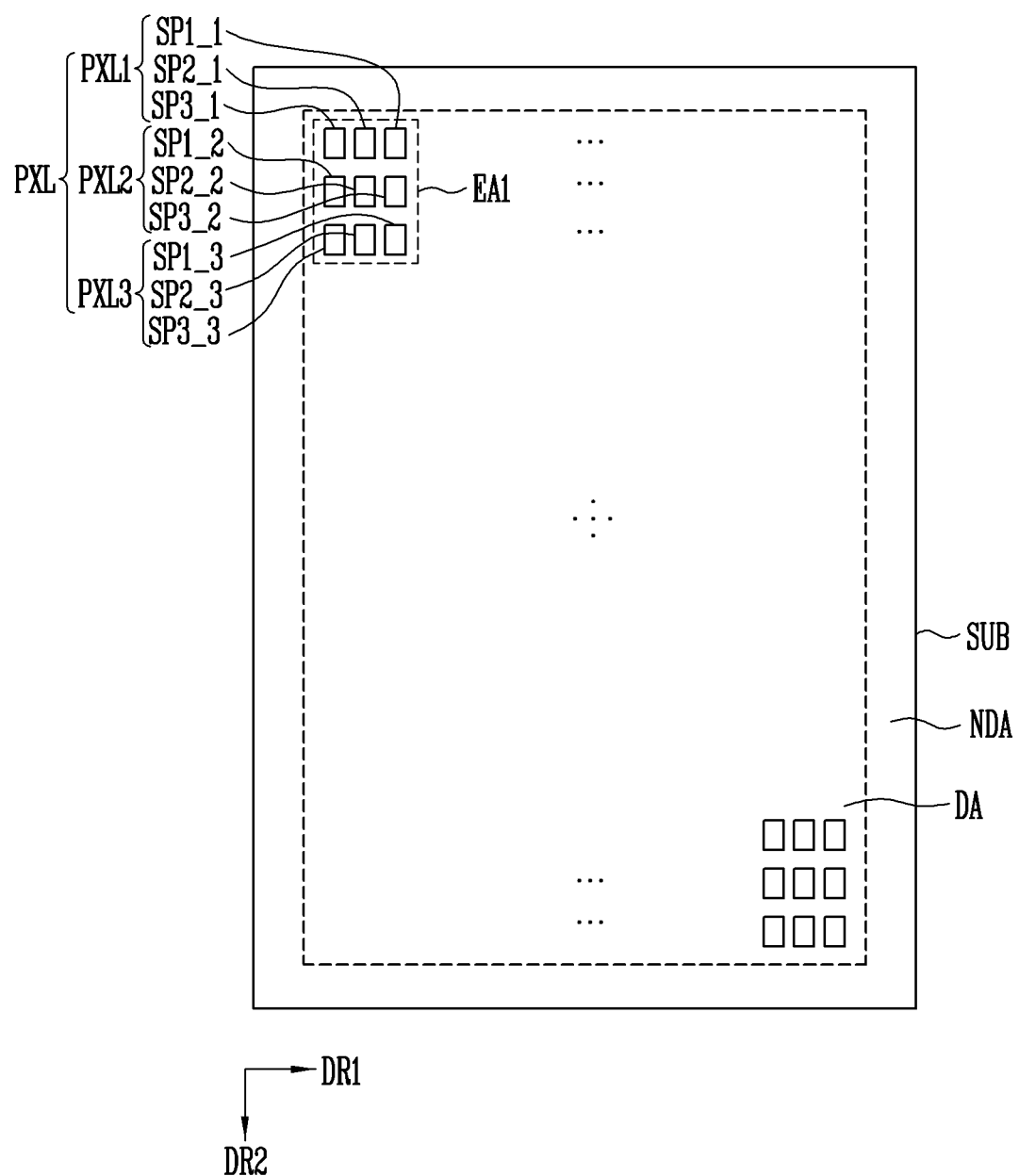
FIG. 2 illustrates a display device in accordance with an embodiment of the disclosure, and particularly, is a schematic plan view illustrating a display device using the light emitting element illustrated in FIG. 1A as a light emitting source.

FIG. 2 illustrates a display device in accordance with an embodiment of the disclosure, and particularly, is a schematic plan view illustrating a display device using the light emitting element illustrated in FIG. 1A as a light emitting source.

For the sake of explanation, FIG. 2 schematically illustrates the structure of the display device, focused on a display area on which an image is displayed. In some embodiments, although not illustrated, at least one driving circuit (e.g., a scan driver and a data driver) and/or signal lines may be further provided in the display device.

Referring to FIGS. 1A and 2, the display device in accordance with the embodiment of the disclosure may include a substrate SUB, pixels PXL provided on the substrate SUB and each including at least one light emitting element LD, a driver (not illustrated) provided on the substrate SUB and configured to drive the pixels PXL, and a line component (not illustrated) provided to electrically connect the pixels PXL with the driver.

The display device may be classified into a passive-matrix type display device and an active-matrix type display device according to a driving method. For example, in the case where the display device in accordance with an embodiment is implemented as an active matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, the contrast, and the working speed have been mainstreamed. However, the disclosure is not limited thereto. For example, passive-matrix type display devices in which pixels PXL may be turned on by groups may also employ components (e.g., first and second electrodes) for driving the light emitting element LD.

The substrate SUB may include a display area DA and a non-display area NDA.

In an embodiment, the display area DA may be disposed in a central area of the display device, and the non-display area NDA may be disposed in a perimeter area of the display device in such a way as to enclose the display area DA. The locations of the display area DA and the non-display area NDA are not limited thereto, and the locations thereof may be changed.

The display area DA may be an area in which the pixels PXL for displaying an image are provided. The non-display area NDA may be an area in which the driver for driving the pixels PXL and some of the line component for coupling the pixels PXL to the driver are provided.

The display area DA may have various shapes. For example, the display area DA may have various forms such as a closed polygon including a straight side, a circle, an ellipse or the like including a curved side, and a semicircle, a semi-ellipse or the like including a straight side and a curved side.

The non-display area NDA may be provided on at least one side of the display area DA. In an embodiment of the disclosure, the non-display area NDA may enclose the display area DA.

The pixels PXL may be disposed in the display area DA on the substrate SUB. Each of the pixels PXL refers to a unit for displaying an image, and multiple pixels PXL may be provided.

Each of the pixels PXL may include the light emitting element LD configured to be driven in response to a corresponding scan signal and a corresponding data signal. The light emitting element LD may have a small size in a range of a nanoscale to a microscale and may be connected in parallel to light emitting elements disposed adjacent thereto. The light emitting element LD may form a light source of the corresponding pixel PXL.

The pixels PXL may be arranged in a matrix form along rows extending in a first direction DR1 and columns extending in a second direction DR2 intersecting the first direction DR1. However, the arrangement of the pixels PXL is not limited to a particular arrangement. In other words, the pixels PXL may be arranged in various forms.

The driver may provide a signal to each pixel PXL through the line component and thus control the operation of the pixel PXL. In FIG. 2, for the sake of explanation, the line component is omitted.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

Figure 3A:
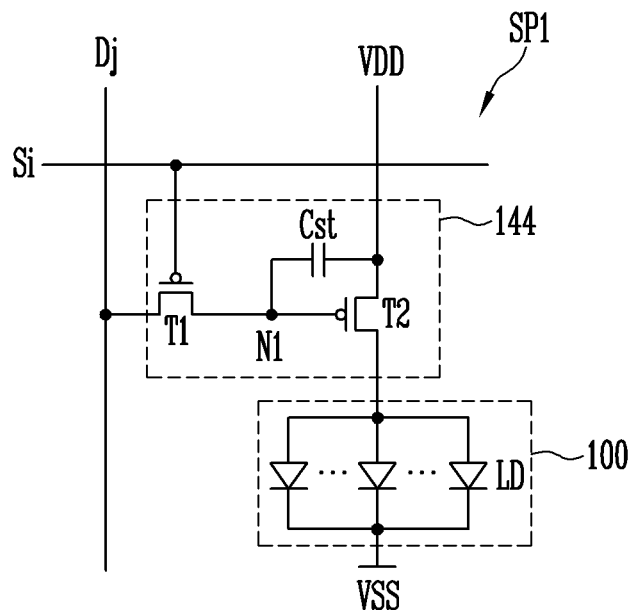
FIGS. 3A to 3C are schematic circuit diagrams illustrating examples of a first sub-pixel of first to third sub-pixels of the display device of FIG. 2 in accordance with various embodiments.
Figure 3B:
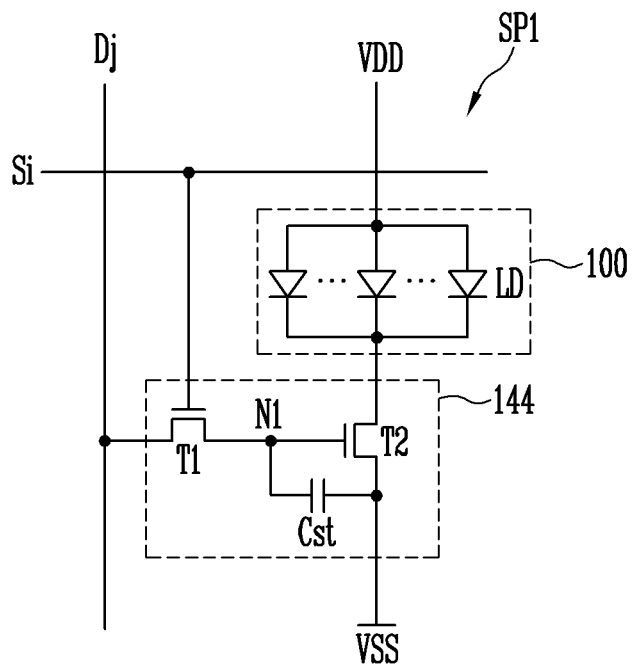
Figure 3C:
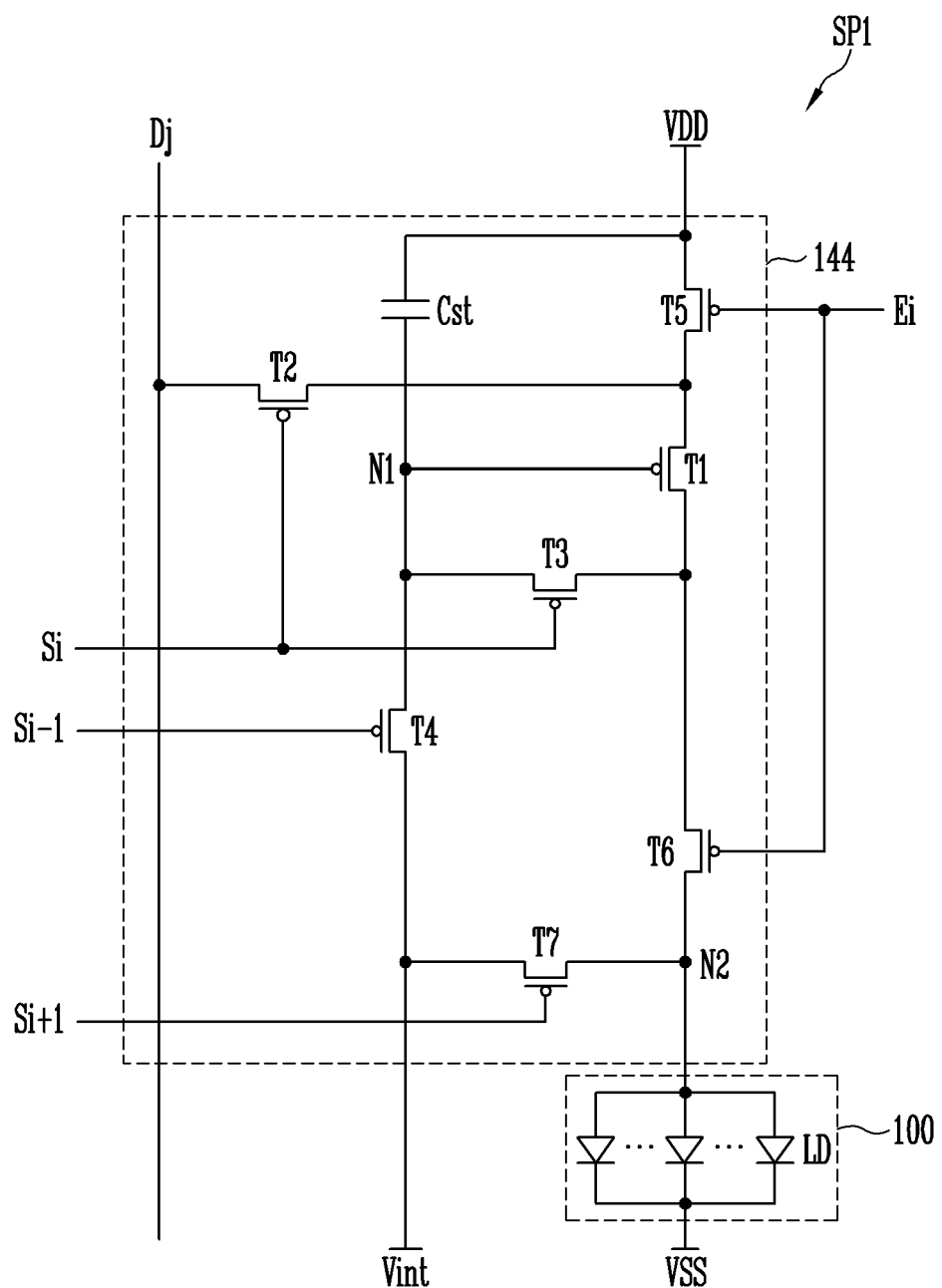

FIGS. 3A to 3C are schematic circuit diagrams illustrating examples of a first sub-pixel in first to third sub-pixels of the display device of FIG. 2 in accordance with various embodiments.

Referring to FIGS. 3A to 3C, each of the first to third sub-pixels may be configured of (or formed of) an active pixel.

However, the type, the configuration, and/or the driving method of each of the first to third sub-pixels is not particularly limited. For example, each of the first to third sub-pixels may be configured of a pixel of a passive or active display device which can have various known structures.

Furthermore, referring to FIGS. 3A to 3C, the first to third sub-pixels may have substantially the same structure or similar structures. Hereinafter, for the sake pf convenience, the first sub-pixel of the first to third sub-pixels will be described as a representative example.

Referring to FIGS. 1A, 2, and 3A, the first sub-pixel SP1 may include an emission circuit 100 configured to generate light having a luminance corresponding to a data signal, and a pixel driving circuit 144 configured to drive the emission circuit 100.

In an embodiment, the emission circuit 100 may include light emitting elements LD connected in parallel between a first driving power supply VDD and a second driving power supply VSS. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a threshold voltage of the light emitting elements LD or greater during an emission period of the first sub-pixel SP1. A first electrode (e.g., an anode electrode) of each of the light emitting elements LD may be electrically connected to the first driving power supply VDD via the pixel driving circuit 144. A second electrode (e.g., a cathode electrode) of each of the light emitting elements LD may be electrically connected to the second driving power supply VSS.

Each of the light emitting elements LD may emit light at a luminance corresponding to driving current which is controlled by the pixel driving circuit 144.

Although FIGS. 3A to 3C illustrate embodiments in which the light emitting elements LD are connected in parallel to each other in the same direction (e.g., a forward direction) between the first and second driving power supplies VDD and VSS, the disclosure is not limited thereto. For example, in an embodiment, some of the light emitting elements LD may be connected in a forward direction between the first and second driving power supplies VDD and VSS, and the others of the light emitting elements LD may be connected in a reverse direction. One of the first and second driving power supplies VDD and VSS may be supplied in the form of alternating voltage. In this case, the light emitting elements LD in the forward direction and the light emitting elements LD in the reverse direction may alternately emit light. As another example, in an embodiment, the first sub-pixel SP1 may include only a single light emitting element LD.

In an embodiment of the disclosure, the pixel driving circuit 144 may include first and second transistors T1 and T2, and a storage capacitor Cst. The structure of the pixel driving circuit 144 is not limited to that of the embodiment illustrated in FIG. 3A.

A first electrode of the first transistor T1 (switching transistor) is electrically connected to a data line Dj, and a second electrode thereof is electrically connected to a first node N1. Here, the first electrode and the second electrode of the first transistor T1 may be different electrodes. For example, if the first electrode is a source electrode, the second electrode is a drain electrode. A gate electrode of the first transistor T1 is electrically connected to a scan line Si.

In case that a scan signal having a voltage (e.g., a low-level voltage) capable of turning on the first transistor T1 is supplied from the scan line Si, the first transistor T1 is turned on to electrically connect the data line Dj with the first node N1. Here, a data signal of a corresponding frame is supplied to the data line Dj, whereby the data signal is transmitted to the first node N1. The data signal transmitted to the first node N1 may be stored in the storage capacitor Cst.

A first electrode of the second transistor T2 (driving transistor) is electrically connected to the first driving power supply VDD, and a second electrode thereof is electrically connected to the first electrode of each of the light emitting elements LD. A gate electrode of the second transistor T2 is electrically connected to the first node N1. As such, the second transistor T2 may control the amount of driving current to be supplied to the light emitting elements LD in response to the voltage of the first node N1.

One electrode of the storage capacitor Cst is electrically connected to the first driving power supply VDD, and the other electrode thereof is electrically connected to the first node N1. The storage capacitor Cst is charged with a voltage corresponding to a data signal supplied to the first node N1, and maintains the charged voltage until a data signal of a subsequent frame is supplied.

For the sake of explanation, FIG. 3A illustrates the pixel driving circuit 144 having a relatively simple structure including the first transistor T1 configured to transmit the data signal to the first sub-pixel SP1, the storage capacitor Cst configured to store the data signal, and the second transistor T2 configured to supply driving current corresponding to the data signal to the light emitting elements LD.

However, the disclosure is not limited thereto, and the structure of the pixel driving circuit 144 may be changed in various ways. For example, the pixel driving circuit 144 may further include at least one transistor such as a transistor configured to compensate for the threshold voltage of the second transistor T2, a transistor configured to initialize the first node N1, and/or a transistor configured to control an emission time of the light emitting elements LD, and/or other circuit elements such as a boosting capacitor for boosting the voltage of the first node N1.

Furthermore, although in FIG. 3A the transistors, e.g., the first and second transistors T1 and T2, included in the pixel driving circuit 144 have been illustrated as being P-type transistors, the disclosure is not limited thereto. In other words, at least one of the first and second transistors T1 and T2 included in the pixel driving circuit 144 may be changed to an N-type transistor.

Referring to FIGS. 1A, 2, and 3B, the first and second transistors T1 and T2 in accordance with an embodiment of the present disclosure may be formed of N-type transistors. The configuration and operation of the pixel driving circuit 144 illustrated in FIG. 3B, other than a change in connection positions of some components due to a change in the type of transistor, are similar to those of the pixel driving circuit 144 of FIG. 3A. Therefore, detailed descriptions will be omitted.

In an embodiment of the disclosure, the configuration of the pixel driving circuit 144 is not limited to the embodiments illustrated in FIGS. 3A and 3B. For example, the pixel driving circuit 144 may be configured in the same manner as that of an embodiment illustrated in FIG. 3C.

Referring to FIGS. TA, 2, and 3C, the pixel driving circuit 144 may be electrically connected to the scan line Si and the data line Dj of the first sub-pixel SP1. For example, if the first sub-pixel SP1 is disposed on an ith row and a jth column of the display area DA, the pixel driving circuit 144 of the first sub-pixel SP1 may be electrically connected to an ith scan line Si and a jth data line Dj of the display area DA.

In an embodiment, the pixel driving circuit 144 may also be electrically connected to at least one scan line. For example, the first sub-pixel SP1 disposed on the ith row of the display area DA may be further connected to an i−1th scan line Si−1 and/or an i+1th scan line Si+1.

In an embodiment, the pixel driving circuit 144 may be electrically connected not only to the first and second driving power supplies VDD and VSS but also to a third power supply. For example, the pixel driving circuit 144 may also be electrically connected to an initialization power supply Vint.

The pixel driving circuit 144 may include first to seventh transistors T1 to T7, and a storage capacitor Cst.

A first electrode of the first transistor T1 (driving transistor), e.g., a source electrode, may be electrically connected to the first driving power supply VDD via the fifth transistor T5, and a second electrode thereof, e.g., a drain electrode, may be electrically connected to an end of each of light emitting elements LD via the sixth transistor T6. A gate electrode of the first transistor T1 may be electrically connected to a first node N1. The first transistor T1 may control driving current flowing between the first driving power supply VDD and the second driving power supply VSS via the light emitting elements LD in response to the voltage of the first node N1.

The second transistor T2 (switching transistor) may be electrically connected between the jth data line Dj electrically connected to the first sub-pixel SP1 and the source electrode of the first transistor T1. A gate electrode of the second transistor T2 is electrically connected to the ith scan line Si connected to the first sub-pixel SP1. In case that a scan signal having a gate-on voltage (e.g., a low-level voltage) is supplied from the ith scan line Si, the second transistor T2 is turned on to electrically connect the jth data line Dj to the source electrode of the first transistor T1. Hence, if the second transistor T2 is turned on, a data signal supplied from the jth data line Dj may be transmitted to the first transistor T1.

The third transistor T3 is electrically connected between the drain electrode of the first transistor T1 and the first node N1. A gate electrode of the third transistor T3 is electrically connected to the ith scan line Si. In case that a scan signal having a gate-on voltage is supplied from the ith scan line Si, the third transistor T3 is turned on to electrically connect the drain electrode of the first transistor T1 to the first node N1. Therefore, in case that the third transistor T3 is turned on, the first transistor T1 may be electrically connected in the form of a diode.

The fourth transistor T4 may be electrically connected between the first node N1 and an initialization power supply Vint. A gate electrode of the fourth transistor T4 is electrically connected to a preceding scan line, e.g., an i−1th scan line Si−1. In case that a scan signal of a gate-on voltage is supplied to the i−1th scan line Si−1, the fourth transistor T4 is turned on so that the voltage of the initialization power supply Vint may be transmitted to the first node N1. Here, the initialization power supply Vint may have a voltage equal to or less than the minimum voltage of the data signal.

The fifth transistor T5 is electrically connected between the first driving power supply VDD and the first transistor T1. A gate electrode of the fifth transistor T5 is electrically connected to a corresponding emission control line, e.g., an ith emission control line Ei. The fifth transistor T5 may be turned off in case that an emission control signal having a gate-off voltage is supplied to the ith emission control line Ei, and may be turned on in other cases.

The sixth transistor T6 is electrically connected between the first transistor T1 and a second node N2, which is electrically connected to first ends of the light emitting elements LD. A gate electrode of the sixth transistor T6 may be electrically connected to the ith emission control line Ei. The sixth transistor T6 may be turned off in case that an emission control signal having a gate-off voltage is supplied to the ith emission control line Ei and may be turned on in other cases.

The seventh transistor T7 is electrically connected between the second node N2, which is electrically connected to the first ends of the light emitting elements LD and the initialization power supply Vint. A gate electrode of the seventh transistor T7 is electrically connected to one of scan lines of a subsequent stage, e.g., to the i+1th scan line Si+1. In case that a scan signal of a gate-on voltage is supplied to the i+1th scan line Si+1, the seventh transistor T7 may be turned on so that the voltage of the initialization power supply Vint may be supplied to the first ends of the light emitting elements LD.

The storage capacitor Cst is electrically connected between the first driving power supply VDD and the first node N1. The storage capacitor Cst may store a voltage corresponding both to the data signal applied to the first node N1 during each frame period and/or to the threshold voltage of the first transistor T1.

For the sake of convenience, FIG. 3C illustrates that all of the first to seventh transistors T1 to T7 are formed of P-type transistors, but the disclosure is not limited thereto. For example, at least one of the first to seventh transistors T1 to T7 included in the pixel driving circuit 144 may be an N-type transistor, or all of the first to seventh transistors T1 to T7 may be N-type transistors.

Figure 4:
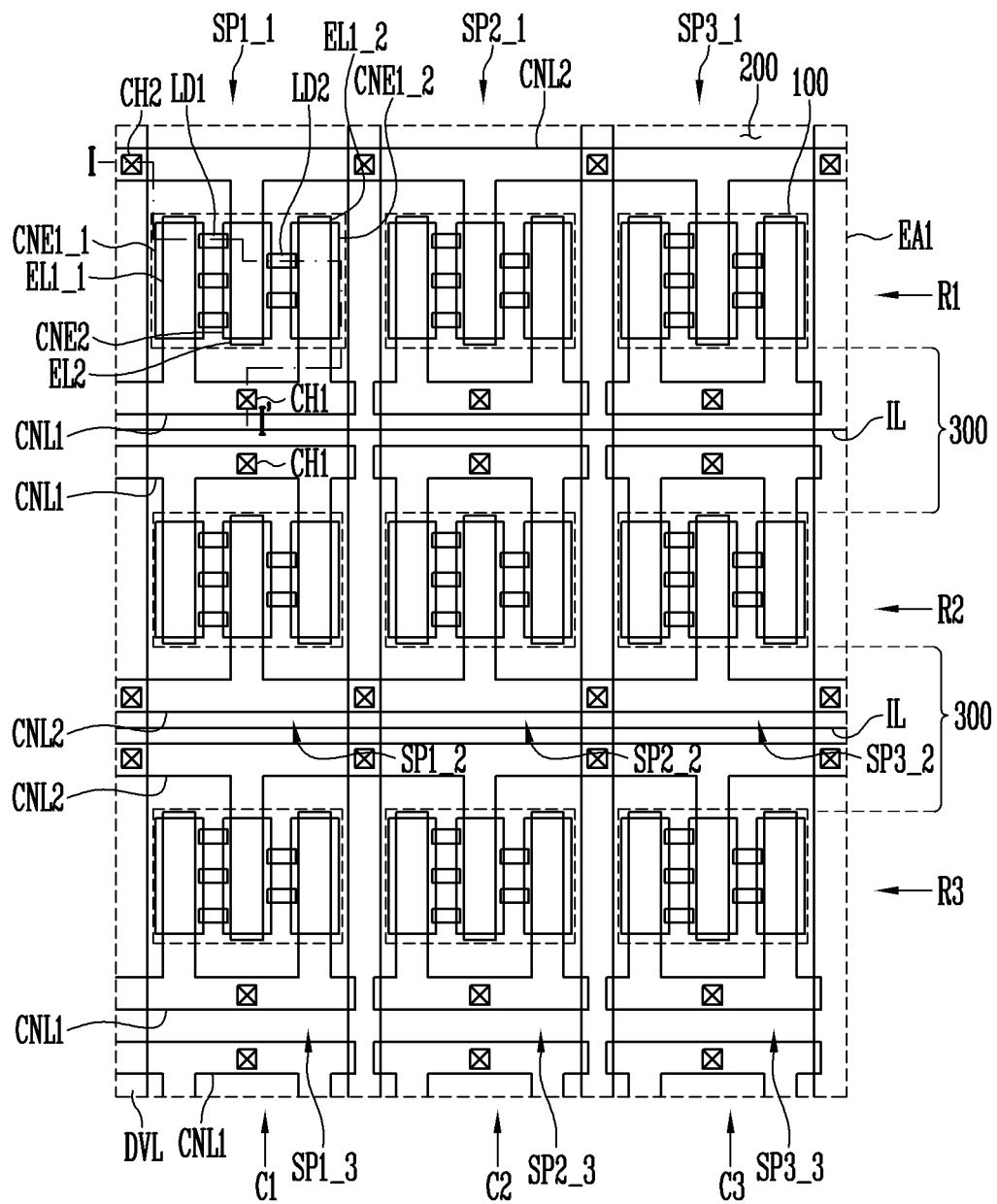
FIG. 4 is a schematic enlarged plan view of area EA1 of FIG. 2.
Figure 5:
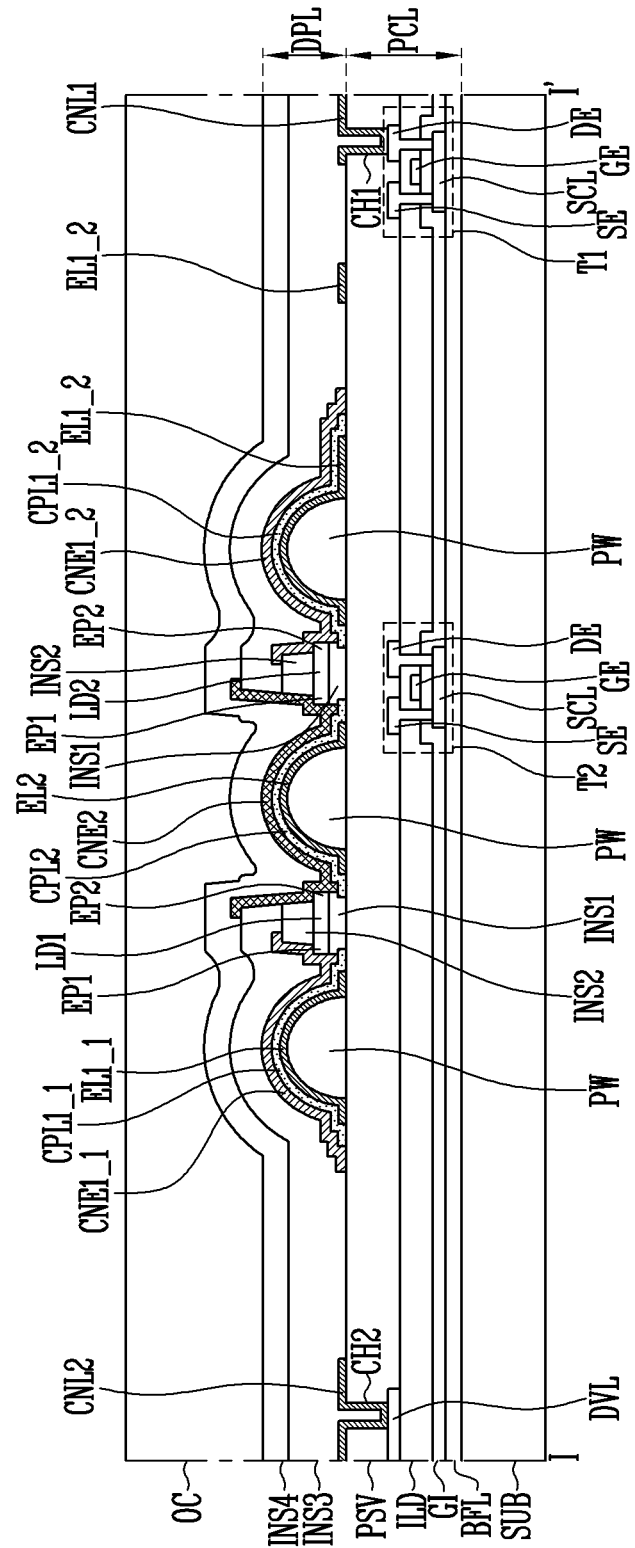
FIG. 5 is a schematic cross-sectional view taken along line I-I' of FIG. 4.
Figure 6A:
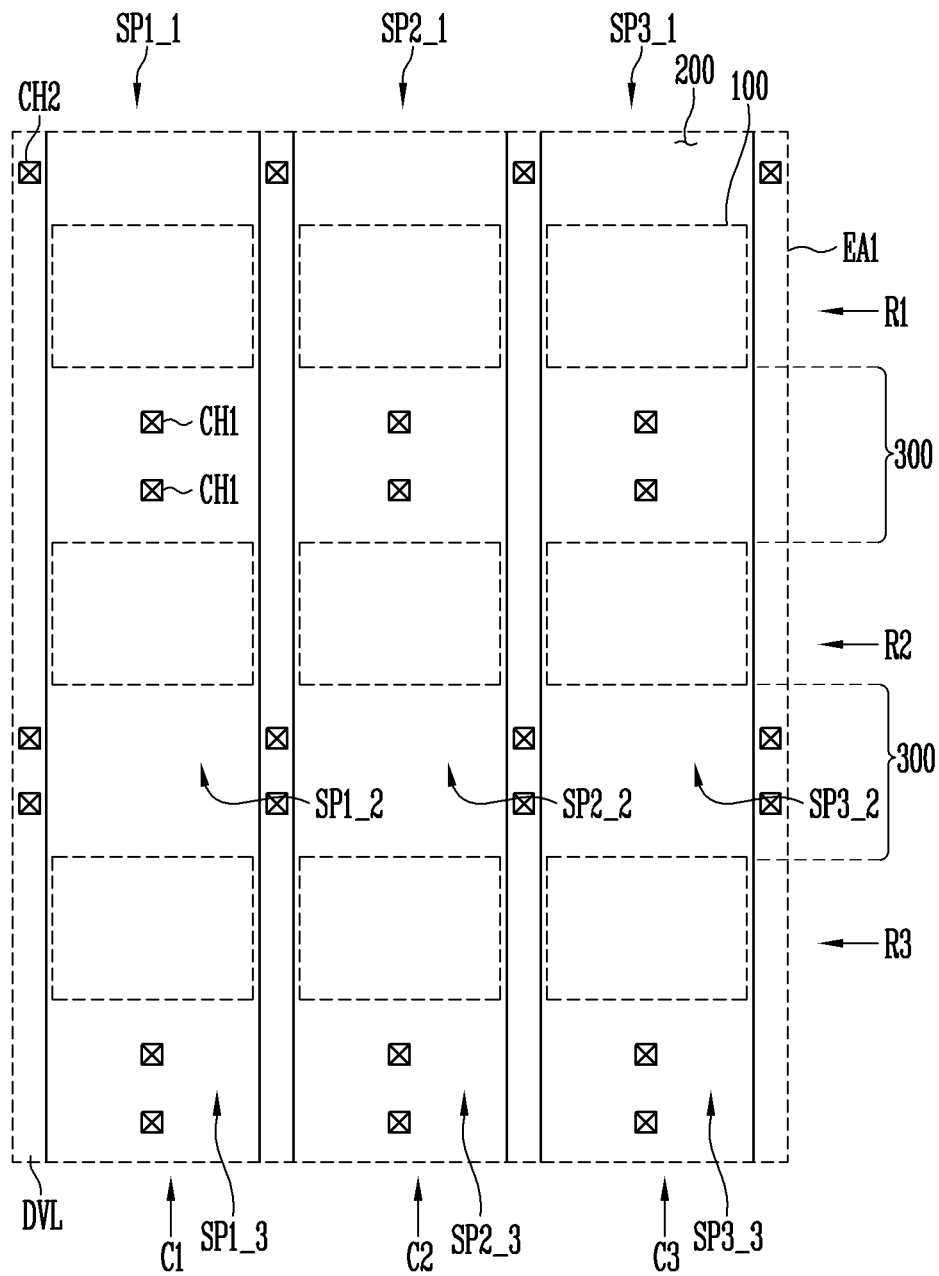
FIGS. 6A to 6F are schematic plan views sequentially illustrating a method of fabricating the display device of FIG. 4.
Figure 6B:
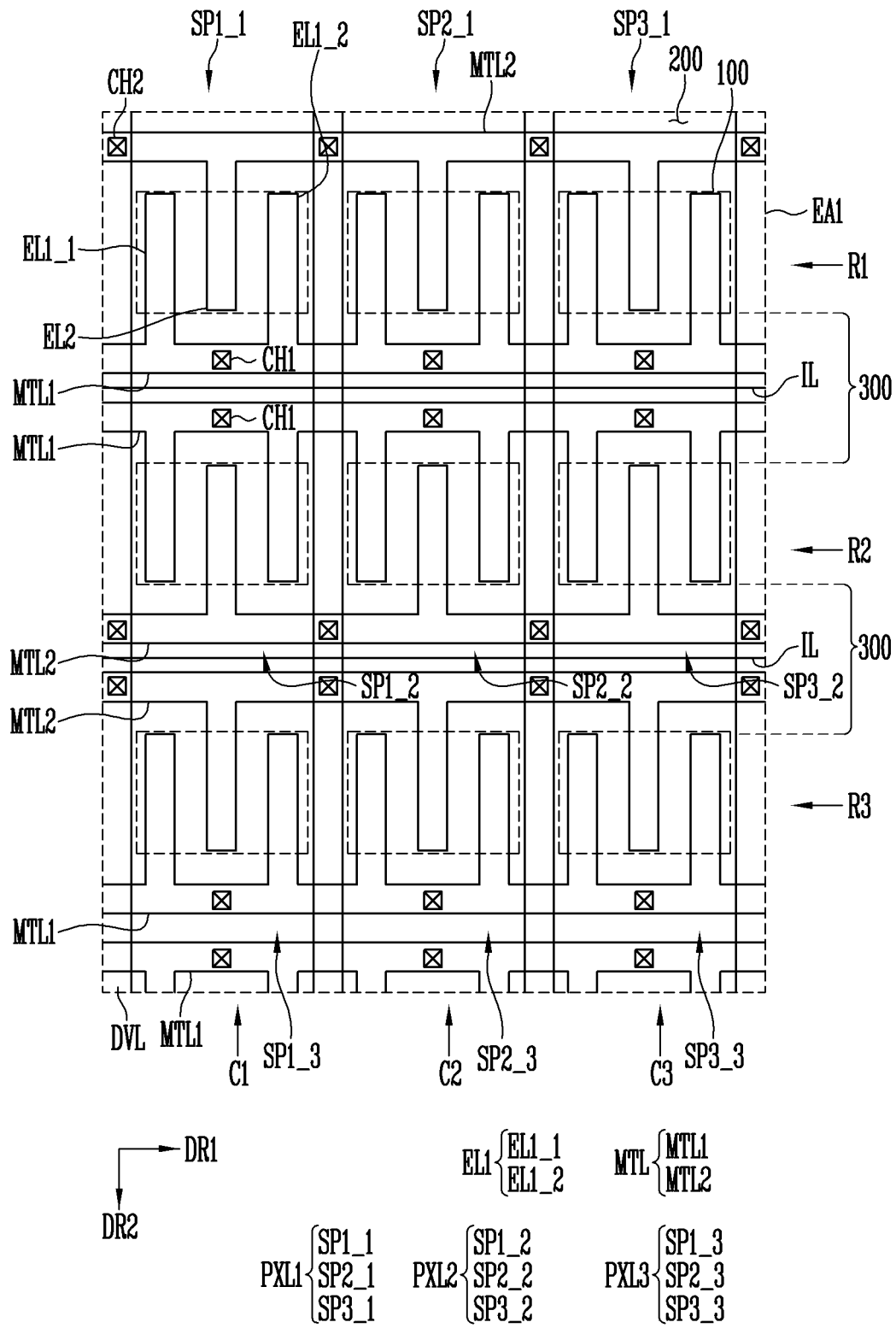
Figure 6C:
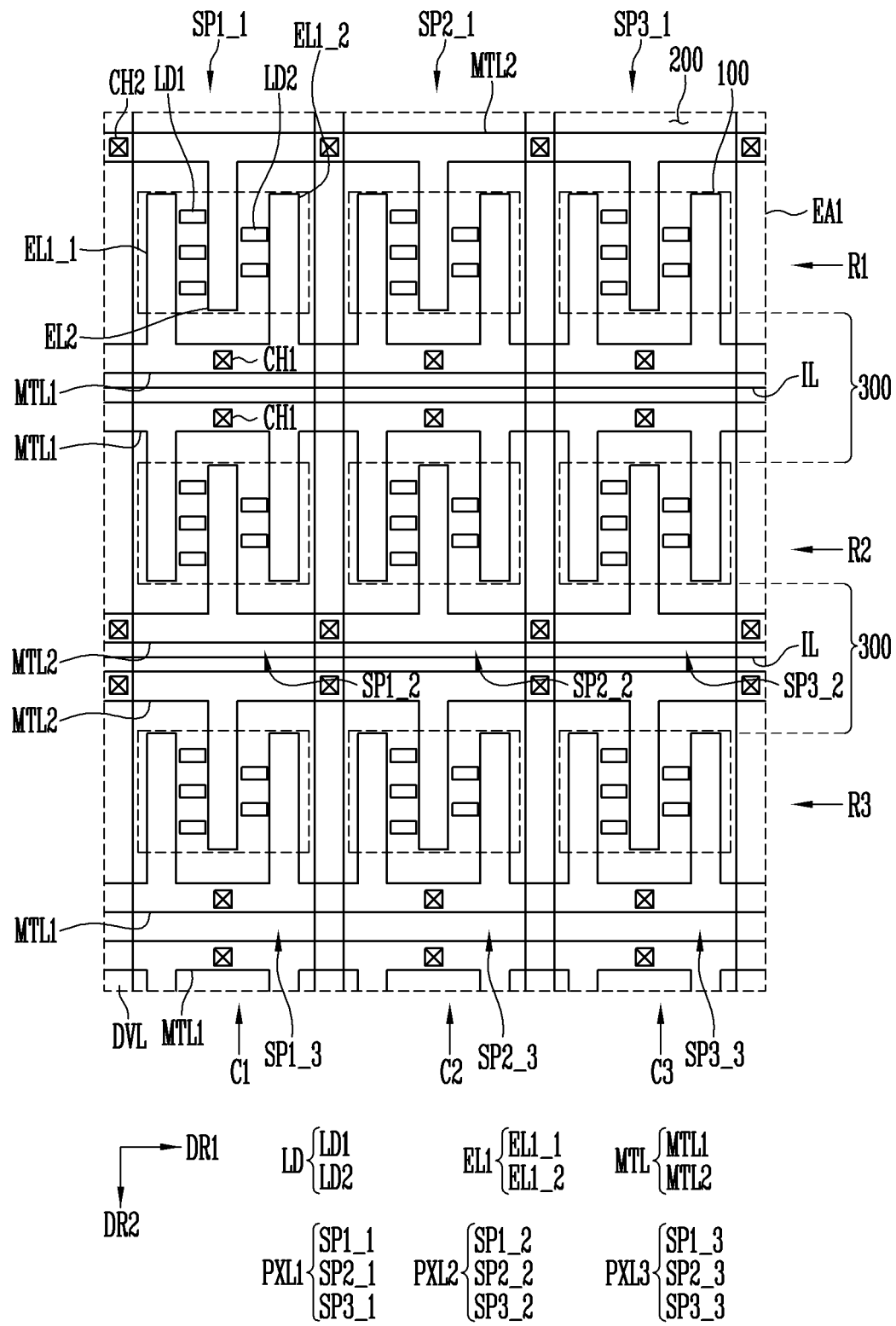
Figure 6D:
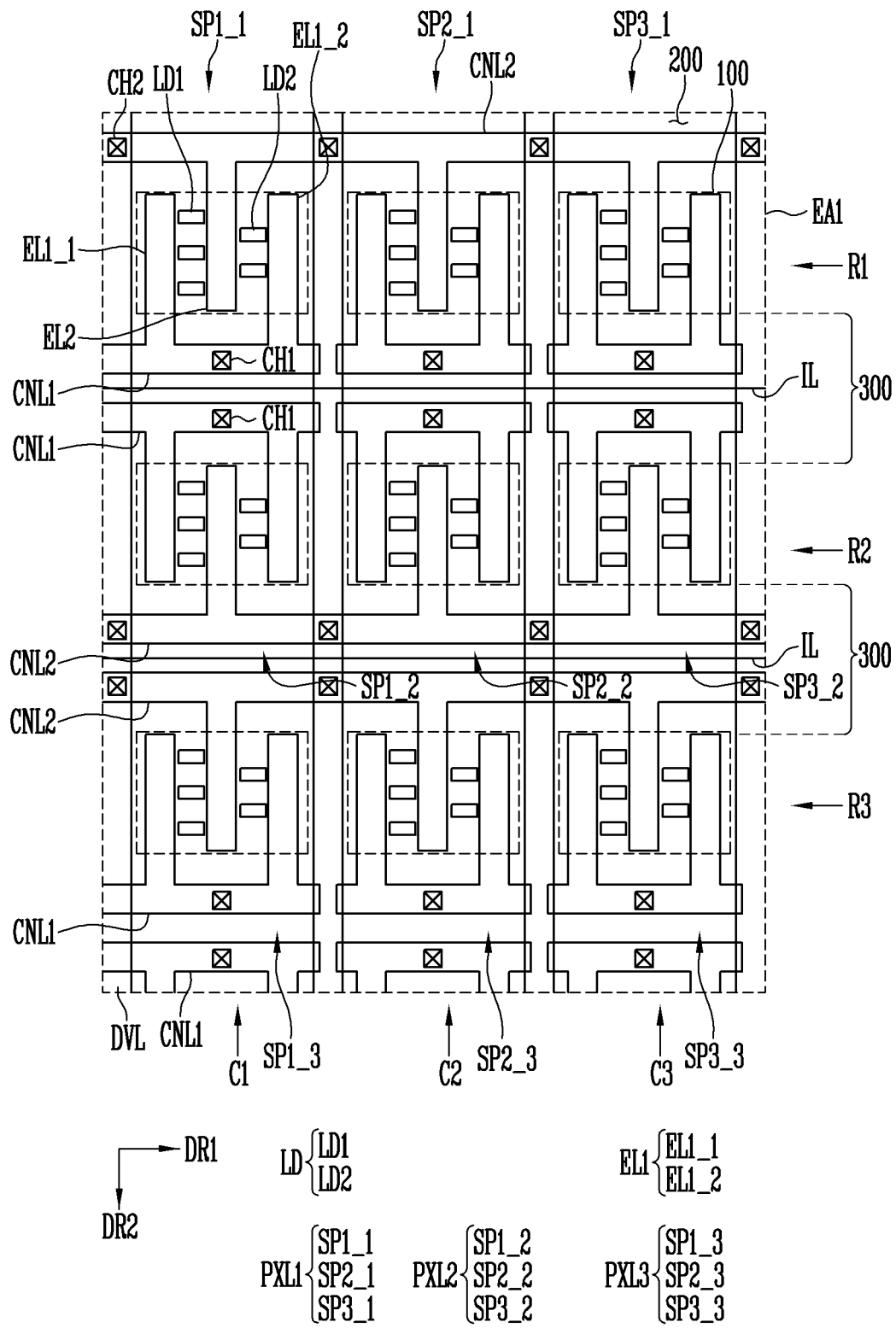
Figure 6E:
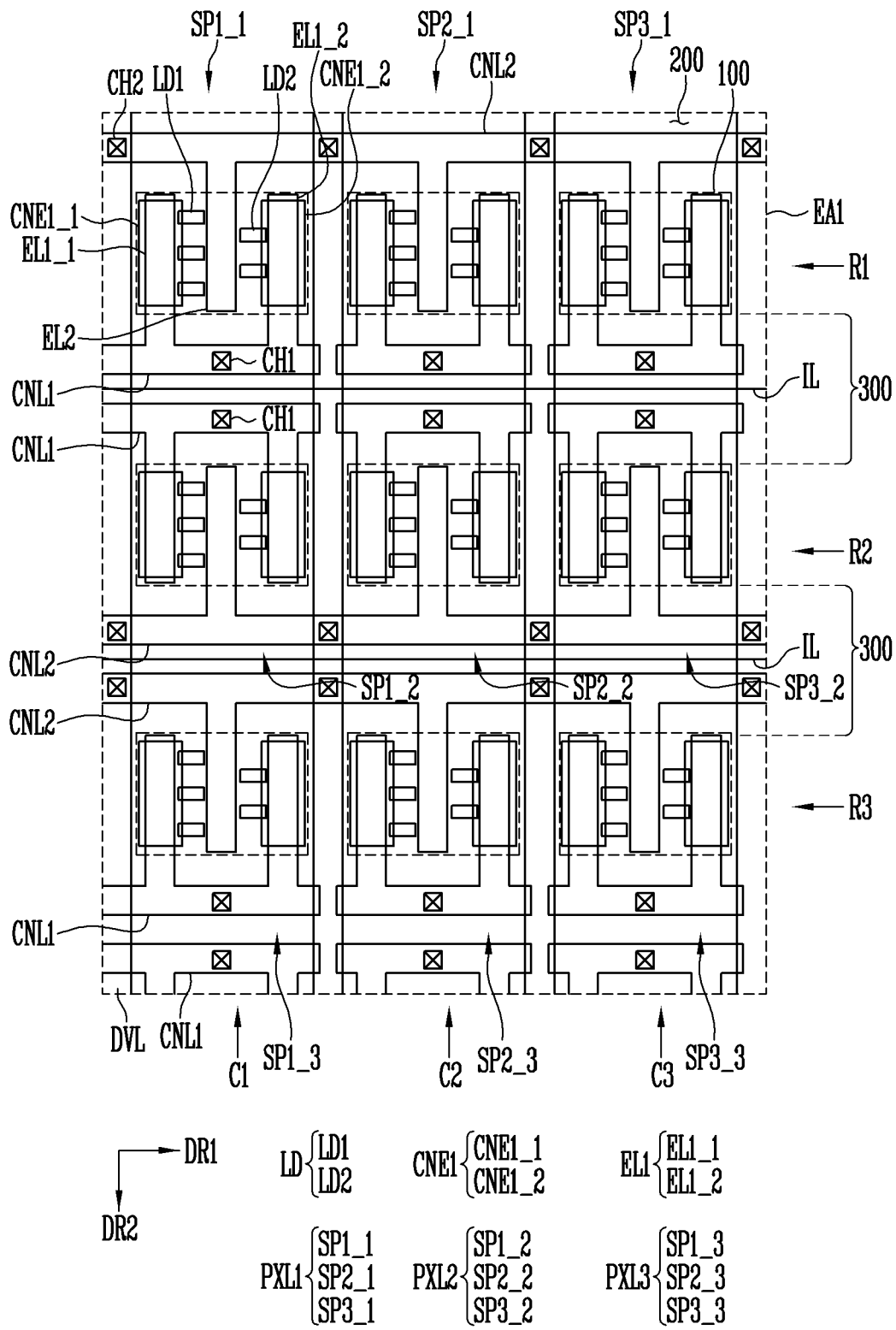
Figure 6F:
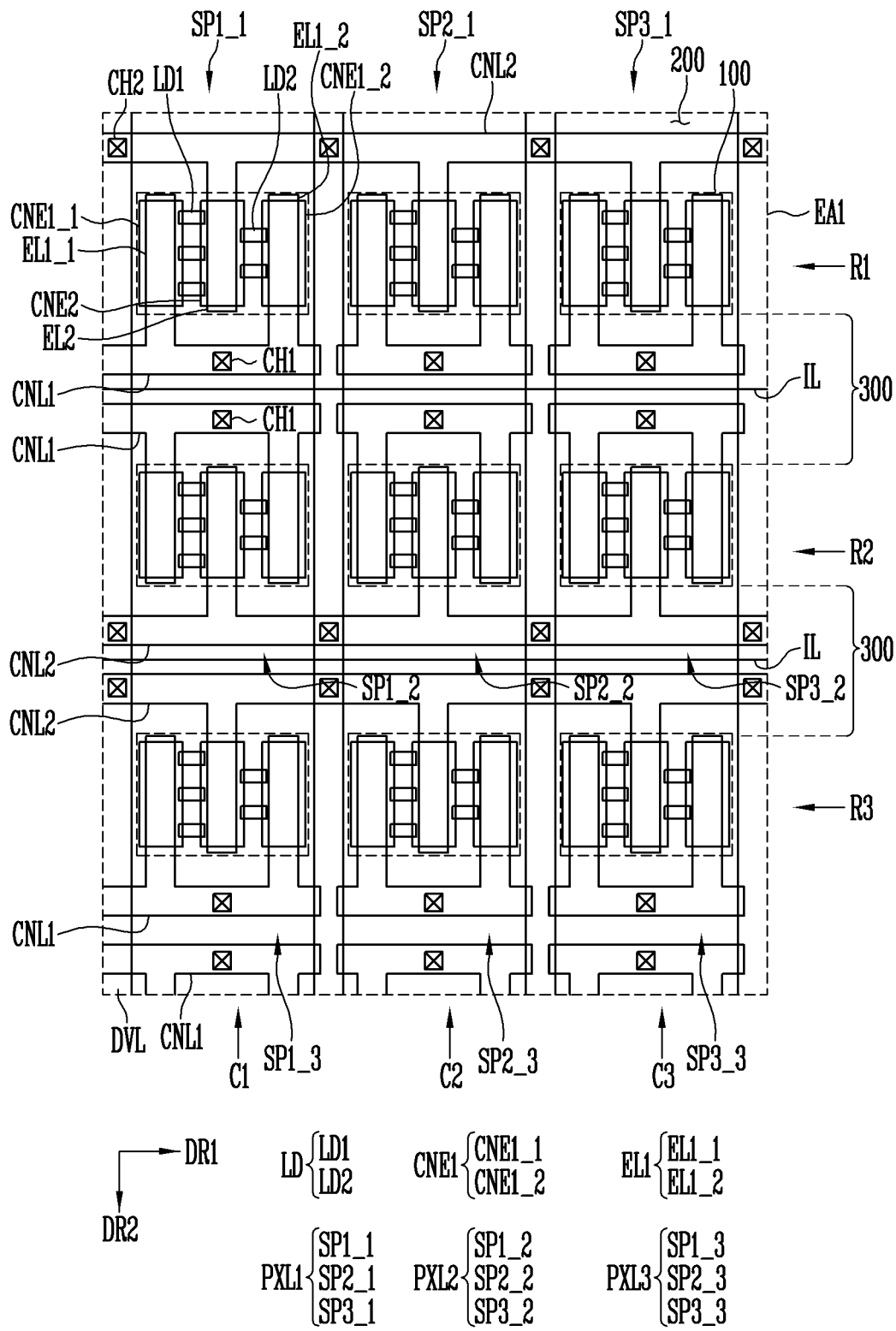

FIG. 4 is a schematic enlarged plan view of an area EA1 of FIG. 2. FIG. 5 is a cross-sectional view taken along line I-I' of FIG. 4.

For the sake of explanation, FIG. 4 schematically illustrates first to third pixels which are disposed adjacent to each other in a column direction and each of which includes three sub-pixels disposed adjacent to each other in a row direction. In detail, FIG. 4 illustrates, with respect to the first to third pixels adjacent to each other in the column direction (e.g., in a vertical direction) in a display area, three sub-pixels included in each of the first to third pixels.

In FIG. 4, for the sake of explanation, light emitting elements provided in each sub-pixel are illustrated as being horizontally aligned. However, the alignment of the light emitting elements is not limited thereto. For example, at least some of the light emitting elements may be aligned in a direction intersecting the horizontal direction.

Furthermore, for the sake of explanation, illustration of transistors connected to the light emitting elements, and signal lines connected to the transistors has been omitted in FIG. 4.

FIGS. 4 and 5 illustrate a simplified structure of each of the first to third pixels, e.g., showing that each electrode has only a single electrode layer, the present disclosure is not limited thereto.

Referring to FIGS. 1A, 2, 4, and 5, the display device in accordance with an embodiment of the disclosure may include a substrate SUB on which pixels PXL are provided. For the sake of explanation, the description of the following embodiment will be focused on three pixels, e.g., first to third pixels PXL1, PXL2, and PXL3, disposed adjacent to each other in the column direction of the substrate SUB among the pixels PXL.

The first to third pixels PXL1, PXL2, and PXL3 may be disposed adjacent to each other in the second direction DR2 on the substrate SUB. In an embodiment, each of the first to third pixels PXL1, PXL2, and PXL3 may include at least one sub-pixel.

In an embodiment of the disclosure, the first pixel PXL1 may include three sub-pixels disposed adjacent to each other in the first direction DR1 on the substrate SUB, e.g., a 1-1th sub-pixel SP1_1, a 2-1th sub-pixel SP2_1, and a 3-1th sub-pixel SP3_1. The 1-1th sub-pixel SP1_1 may be disposed on a first column C1 and a first row R1 of the substrate SUB. The 2-1th sub-pixel SP2_1 may be disposed on a second column C2 and the first row R1 of the substrate SUB. The 3-1th sub-pixel SP3_1 may be disposed on a third column C3 and the first row R1 of the substrate SUB.

Each of the 1-1th sub-pixel SP1_1, the 2-1th sub-pixel SP2_1, and the 3-1th sub-pixel SP3_1 may include an emission circuit 100 (hereinafter, referred to as "emission area") configured to emit light, and a non-emission area 200 disposed around a perimeter of the emission area 100 and through which the light is not emitted. In an embodiment of the disclosure, a pixel area of each of the 1-1th sub-pixel SP1_1, the 2-1th sub-pixel SP2_1, and the 3-1th sub-pixel SP3_1 may include the emission area 100 and the non-emission area 200 of the corresponding sub-pixel.

The substrate SUB, a pixel circuit layer PCL, and a display element layer DPL may be provided in the pixel area of each of the 1-1th sub-pixel SP1_1, the 2-1th sub-pixel SP2_1, and the 3-1th sub-pixel SP3_1.

In an embodiment of the disclosure, the second pixel PXL2 may include three sub-pixels disposed adjacent to each other in the first direction DR1 on the substrate SUB, e.g., a 1-2th sub-pixel SP1_2, a 2-2th sub-pixel SP2_2, and a 3-2th sub-pixel SP3_2. The 1-2th sub-pixel SP1_2 may be disposed on the first column C1 and a second row R2 of the substrate SUB. The 2-2th sub-pixel SP2_2 may be disposed on the second column C2 and the second row R2 of the substrate SUB. The 3-2th sub-pixel SP3_2 may be disposed on the third column C3 and the second row R2 of the substrate SUB.

Each of the 1-2th sub-pixel SP1_2, the 2-2th sub-pixel SP2_2, and the 3-2th sub-pixel SP3_2 may include an emission area 100 configured to emit light, and a non-emission area 200 disposed around a perimeter of the emission area 100. In an embodiment of the disclosure, a pixel area of each of the 1-2th sub-pixel SP1_2, the 2-2th sub-pixel SP2_2, and the 3-2th sub-pixel SP3_2 may include the emission area 100 and the non-emission area 200 of the corresponding sub-pixel. The substrate SUB, a pixel circuit layer PCL, and a display element layer DPL may be provided in the pixel area of each of the 1-2th sub-pixel SP1_2, the 2-2th sub-pixel SP2_2, and the 3-2th sub-pixel SP3_2.

In an embodiment of the disclosure, the third pixel PXL3 may include three sub-pixels disposed adjacent to each other in the first direction DR1 on the substrate SUB, e.g., a 1-3th sub-pixel SP1_3, a 2-3th sub-pixel SP2_3, and a 3-3th sub-pixel SP3_3. The 1-3th sub-pixel SP1_3 may be disposed on the first column C1 and a third row R3 of the substrate SUB. The 2-3th sub-pixel SP2_3 may be disposed on the second column C2 and the third row R3 of the substrate SUB. The 3-3th sub-pixel SP3_3 may be disposed on the third column C3 and the third row R3 of the substrate SUB.

Each of the 1-3th sub-pixel SP1_3, the 2-3th sub-pixel SP2_3, and the 3-3th sub-pixel SP3_3 may include an emission area 100 configured to emit light, and a non-emission area 200 disposed around a perimeter of the emission area 100. In an embodiment of the disclosure, a pixel area of each of the 1-3th sub-pixel SP1_3, the 2-3th sub-pixel SP2_3, and the 3-3th sub-pixel SP3_3 may include the emission area 100 and the non-emission area 200 of the corresponding sub-pixel. The substrate SUB, a pixel circuit layer PCL, and a display element layer DPL may be provided in the pixel area of each of the 1-3th sub-pixel SP1_3, the 2-3th sub-pixel SP2_3, and the 3-3th sub-pixel SP3_3.

The pixel circuit layer PCL of each of the nine sub-pixels SP1_1, SP2_1, SP3_1, SP1_2, SP2_2, SP3_2, SP1_3, SP2_3, and SP3_3 may include a buffer layer BFL disposed on the substrate SUB, first and second transistors T1 and T2 disposed on the buffer layer BFL, and a driving voltage line DVL. Furthermore, the pixel circuit layer PCL may further include a passivation layer PSV which is provided on the first and second transistors T1 and T2 and the driving voltage line DVL.

The substrate SUB may include an insulating material such as glass, an organic polymer, or crystal. Furthermore, the substrate SUB may be made of (or include) a material having flexibility so as to be bendable or foldable, and have a single-layer or multi-layer structure.

The buffer layer BFL may be provided on the substrate SUB and prevent impurities from diffusing into the first and second transistors T1 and T2. The buffer layer BFL may be omitted depending for example on the material of the substrate SUB or processing conditions.

The first transistor T1 may be a driving transistor which is electrically connected to some of the light emitting elements LD provided in the display element layer DPL of a corresponding sub-pixel to drive the light emitting elements LD. The second transistor T2 may correspond to a switching transistor configured to switch the first transistor T1.

Each of the first and second transistors T1 and T2 may include a semiconductor layer SCL, a gate electrode GE, and a source electrode SE, and a drain electrode DE.

The semiconductor layer SCL may be disposed on the buffer layer BFL. The semiconductor layer SCL may include a source area which electrically contacts the source electrode SE, and a drain area which electrically contacts the drain electrode DE. An area between the source area and the drain area may be a channel area.

The semiconductor layer SCL may include a semiconductor pattern formed of polysilicon, amorphous silicon, an oxide semiconductor, etc. The channel area may be an intrinsic semiconductor, which is an undoped semiconductor pattern. Each of the source area and the drain area may include a semiconductor pattern doped with an impurity.

The gate electrode GE may be provided on the semiconductor layer SCL with the gate insulating layer GI interposed therebetween.

The source electrode SE and the drain electrode DE may respectively contact the source area and the drain area of the semiconductor layer SCL through a corresponding contact hole(s) which pass through an interlayer insulating layer ILD and the gate insulating layer GI.

The driving voltage line DVL may be provided on the interlayer insulating layer ILD, but the disclosure is not limited thereto. In some embodiments, the driving voltage line DVL may be provided on one of insulating layers included in the pixel circuit layer PCL. The second driving power supply VSS (refer to FIG. 3A) may be applied to the driving voltage line DVL.

The passivation layer PSV may include a first contact hole CH1 which exposes at least a portion of the drain electrode DE of the first transistor T1, and a second contact hole CH2 which exposes at least a portion of the driving voltage line DVL.

The display element layer DPL of each of the nine sub-pixels SP1_1, SP2_1, SP3_1, SP1_2, SP2_2, SP3_2, SP1_3, SP2_3, and SP3_3 may include a partition wall (or wall) PW, first and second electrodes EL1 and EL2, first and second connection lines CNL1 and CNL2, light emitting elements LD, and first and second contact electrodes CNE1 and CNE2 which are provided on the passivation layer PSV.

The partition wall PW may be provided on the passivation layer PSV in the emission area 100 of each of the nine sub-pixels SP1_1, SP2_1, SP3_1, SP1_2, SP2_2, SP3_2, SP1_3, SP2_3, and SP3_3. Although not illustrated, a pixel defining layer (or a dam layer) formed of the same material as that of the partition wall PW may be formed and/or provided in the peripheral area 200 between adjacent sub-pixels to define the emission area 100 of each sub-pixel.

The partition wall PW may be spaced by a predetermined distance apart from a partition wall PW disposed adjacent thereto on the passivation layer PSV. Two adjacent partition walls PW may be disposed on the passivation layer PSV and be spaced apart from each other by a length L of one light emitting element LD. As illustrated in FIG. 5, the partition wall PW may include a curved surface having a cross-sectional shape such as a semicircle, or a semi-ellipse, the width of which reduces from a surface of the passivation layer PSV toward an upper end thereof, but the disclosure is not limited thereto.

In an embodiment, the partition wall PW may have a trapezoidal cross-section, the width of which reduces from the surface of the passivation layer PSV toward an upper end thereof. In a cross-sectional view, the shape of each partition wall PW is not limited to the foregoing examples, and may be changed in various ways as long as the efficiency of light emitted from each of the light emitting elements LD may be enhanced. The two adjacent partition walls PW may be disposed on the same plane on the passivation layer PSV and have the same height.

In an embodiment of the disclosure, each of the light emitting elements LD may be formed of (or include) a light emitting diode that includes material having an inorganic crystal structure and has a subminiature size, e.g., in a range of nanoscale to microscale. The light emitting elements LD may be provided in the emission area 100 of each sub-pixel and emit light.

Each of the light emitting elements LD may include a first conductive semiconductor layer 11, a second conductive semiconductor layer 13, and an active layer 12 interposed between the first and second conductive semiconductor layers 11 and 13. In some embodiments, each of the light emitting elements LD may further include an electrode layer 15 provided on a side of the second conductive semiconductor layer 13.

Each of the light emitting elements LD may include a first end EP1 and a second end EP2. One of the first and second conductive semiconductor layers 11 and 13 may be disposed on the first end EP1, and the other of the first and second conductive semiconductor layers 11 and 13 may be disposed on the second end EP2. In an embodiment of the disclosure, each of the light emitting elements LD may emit one light of color light and/or white light.

A second insulating layer INS2 covering or overlapping a portion of an upper surface of each of the light emitting elements LD may be provided on the light emitting elements LD. Hence, the opposite ends EP1 and EP2 of each of the light emitting elements LD may be exposed to the outside.

A first insulating layer INS1 may be provided under each of the light emitting elements LD. The first insulating layer INS1 may fill a space between the passivation layer PSV and each of the light emitting elements LD to stably support the light emitting elements LD and prevent the light emitting elements LD from being removed from the passivation layer PSV. The first insulating layer INS1 may be formed of an inorganic insulating layer including inorganic material, or an organic insulating layer including organic material.

The first connection line CNL1 and the second connection line CNL2 may be provided in the non-emission area 200 of each sub-pixel.

The second connection line CNL2 may extend from the non-emission area 200 of each sub-pixel to the non-emission area 200 of a sub-pixel adjacent thereto. For example, the second connection line CNL2 provided in the non-emission area 200 of the 1-1th sub-pixel SP1_1 may extend in the first direction DR1 to sub-pixels adjacent to the 1-1th sub-pixel SP1_1, i.e., 2-1th and 3-1th sub-pixels SP2_1 and SP3_1. The second connection line CNL2 may be provided in common in the 1-1th, 2-1th, and 3-1th sub-pixels SP1_1, SP2_1, and SP3_1.

The first connection line CNL1 may be provided, to independently drive each sub-pixel, only in the non-emission area 200 of the corresponding sub-pixel. For example, the first connection line CNL1 provided in the non-emission area 200 of the 1-1th sub-pixel SP1_1 may be electrically disconnected and/or physically separated from the first connection line CNL1 provided in the non-emission area 200 of the 2-1th sub-pixel SP2_1 adjacent to the 1-1th sub-pixel SP1_1. The first connection line CNL1 provided in the non-emission area 200 of the 2-1th sub-pixel SP2_1 may be electrically disconnected and/or physically separated from the first connection line CNL1 provided in the non-emission area 200 of the 3-1th sub-pixel SP3_1 adjacent to the 2-1th sub-pixel SP2_1.

The first and second connection lines CNL1 and CNL2 may be provided on the same layer of the same surface, and include the same material.

The first electrode EL1 and the second electrode EL2 may be provided in the emission area 100 of each sub-pixel, and each may have a bar shape extending in the second direction DR2 intersecting with the first direction DR1. The first electrode EL1 and the second electrode EL2 may be provided on the same plane (or layer) and spaced apart from each other by a predetermined distance.

The first electrode EL1 may include a 1-1th electrode EL1_1 and a 1-2th electrode EL1_2 which diverge into the emission area 100 of each sub-pixel in the second direction DR2 from the first connection line CNL1 extending in the first direction DR1. The 1-1th electrode EL1_1, the 1-2th electrode EL1_2, and the first connection line CNL1 may be integral with each other and/or electrically and/or physically connected to each other.

The second electrode EL2 may extend in the second direction DR2 and may be electrically connected with the second connection line CNL2. In an embodiment of the disclosure, the second electrode EL2 may diverge in the second direction DR2 from the second connection line CNL2 into the emission area 100 of each sub-pixel. The second electrode EL2 and the second connection line CNL2 may be integral with each other and/or electrically and/or physically connected to each other.

Each of the first and second electrodes EL1 and EL2 may function as an alignment electrode for aligning the light emitting elements LD in the emission area 100 of each sub-pixel.

Before the light emitting elements LD are aligned in the emission area 100 of each sub-pixel, a first alignment voltage may be applied to the first electrode EL1 through the first connection line CNL1, and a second alignment voltage may be applied to the second electrode EL2 through the second connection line CNL2. The first alignment voltage and the second alignment voltage may have different voltage levels. As predetermined alignment voltages having different voltage levels are respectively applied to the first electrode EL1 and the second electrode EL2, an electric field may be formed between the first electrode EL1 and the second electrode EL2. Hence, the light emitting elements LD may be aligned on the passivation layer PSV between the first electrode EL1 and the second electrode EL2.

In a plan view, the second electrode EL2 may be provided between the 1-1th electrode EL1_1 and the 1-2th electrode EL1_2 and spaced apart from each of the 1-1th and 1-2th electrodes EL1_1 and EL1_2 by a predetermined distance. The 1-1th electrode EL1_1, the 1-2th electrode EL1_2, and the second electrode EL2 may be alternately disposed on the passivation layer PSV.

After the light emitting elements LD are aligned in the emission area 100 of each sub-pixel, each of the first and second electrodes EL1 and EL2 may function as a driving electrode for driving the light emitting elements LD.

The first and second electrodes EL1 and EL2 may be made of a material having a predetermined reflectivity to allow light emitted from the opposite ends EP1 and EP2 of each of the light emitting elements LD to travel in a direction (e.g., in a frontal direction) in which an image of the display device is displayed.

In an embodiment of the disclosure, the first and second electrodes EL1 and EL2, the first connection line CNL1, and the second connection line CNL2 may be provided on the same layer and formed of the same material.

The first and second electrodes EL1 and EL2, the first connection line CNL1, and the second connection line CNL2 may be formed of (or include) a conductive material having a predetermined reflectivity. The conductive material may include metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT. The materials of the first and second electrodes EL1 and EL2, the first connection line CNL1, and the second connection line CNL2 are not limited to the foregoing materials.

Each of the first and second electrodes EL1 and EL2, the first connection line CNL1, and the second connection line CNL2 may have a single layer structure, but the disclosure is not limited thereto, for example, it may have a multi-layer structure formed by stacking two or more materials of metals, alloys, conductive oxides, and conductive polymers. In an embodiment, each of the first and second electrodes EL1 and EL2, the first connection line CNL1, and the second connection line CNL2 may have a multi-layer structure to reduce or minimize a voltage drop due to a signal delay in case that a signal is transmitted to the opposite ends EP1 and EP2 of each of the light emitting elements LD.

Since at least a portion of the first and second electrodes EL1 and EL2 have shapes corresponding to the shape of the partition wall PW, light emitted from the opposite ends EP1 and EP2 of each of the light emitting elements LD may be reflected by the first and second electrodes EL1 and EL2 and more effectively travel in the frontal direction of the display device. Consequently, the efficiency of light emitted from the light emitting elements LD may be enhanced.

In an embodiment of the disclosure, the partition wall PW and the first and second electrodes EL1 and EL2 may function as reflective components enabling light emitted from each of the light emitting elements LD to travel in the frontal direction of the display device, thus enhancing the light output efficiency of the light emitting elements LD.

Any one of the first and second electrodes EL1 and EL2 may correspond to an anode electrode, and the other may correspond to a cathode electrode. In an embodiment of the disclosure, the first electrode EL1 may be an anode electrode, and the second electrode EL2 may be a cathode electrode.

In an embodiment of the disclosure, the light emitting elements LD may include first light emitting elements LD1 aligned between the 1-1th electrode EL1_1 and the second electrode EL2, and second light emitting elements LD2 aligned between the second electrode EL2 and the 1-2th electrode EL1_2.

In an embodiment of the disclosure, the first connection line CNL1 may be electrically connected to the drain electrode DE of the first transistor T1 through the first contact hole CH1 of the passivation layer PSV. Since the first connection line CNL1 is integral with the first electrode EL1, a signal of the first transistor T1 applied to the first connection line CNL1 may be transmitted to the first electrode EL1.

The first electrode EL1 may be disposed adjacent to one of the opposite ends EP1 and EP2 of each of the light emitting elements LD, and may be electrically connected to each of the light emitting elements LD through the first contact electrode CNE1. Therefore, a signal of the first transistor T1 that is applied to the first electrode EL1 may be transmitted to each of the light emitting elements LD through the first contact electrode CNE1.

In an embodiment of the disclosure, the second connection line CNL2 may be electrically connected to the driving voltage line DVL through the second contact hole CH2 of the passivation layer PSV. Since the second connection line CNL2 is integral with the second electrode EL2, the voltage of the second driving power supply VSS of the driving voltage line DVL applied to the second connection line CNL2 may be transmitted to the second electrode EL2.

The second electrode EL2 may be disposed adjacent to the other end of the opposite ends EP1 and EP2 of each of the light emitting elements LD, and may be electrically connected to each of the light emitting elements LD through the second contact electrode CNE2. Hence, the voltage of the second driving power supply VSS applied to the second electrode EL2 may be transmitted to each of the light emitting elements LD.

The first contact electrode CNE1 may be provided on the first electrode EL1 to electrically and/or physically reliably connect the first electrode EL1 with one of the opposite ends EP1 and EP2 of each of the light emitting elements LD. The first contact electrode CNE1 may be formed of a transparent conductive material to allow light emitted from each of the light emitting elements LD and reflected by the first electrode EL1 in the frontal direction of the display device to travel in the frontal direction without loss.

In a plan view, the first contact electrode CNE1 may cover or overlap the first electrode EL1. Furthermore, the first contact electrode CNE1 may partially overlap one of the opposite ends EP1 and EP2 of each of the light emitting elements LD.

In an embodiment of the disclosure, the first contact electrode CNE1 may include a 1-1th contact electrode CNE1_1 provided on the 1-1th electrode EL1_1, and a 1-2th contact electrode CNE1_2 provided on the 1-2th electrode EL1_2. In a plan view, the 1-1th contact electrode CNE1_1 may overlap the first end EP1 of each of the first light emitting elements LD1 and the 1-1th electrode EL1_1. In a plan view, the 1-2th contact electrode CNE1_2 may overlap the second end EP2 of each of the second light emitting elements LD2 and the 1-2th electrode EL1_2.

A third insulating layer INS3 covering or overlapping the first contact electrode CNE1 may be provided on the first contact electrode CNE1. The third insulating layer INS3 may prevent the first contact electrode CNE1 from being exposed to the outside, thus preventing the first contact electrode CNE1 from corroding.

The third insulating layer INS3 may be formed of an inorganic insulating layer including an inorganic material, or an organic insulating layer including an organic material. Although the third insulating layer INS3 may have a single layer structure as shown in the drawing, the disclosure is not limited thereto. For example, the third insulating layer INS3 may have a multi-layer structure. In the case where the third insulating layer INS3 has a multi-layer structure, the third insulating layer INS3 may have a structure formed by alternately stacking inorganic insulating layers and organic insulating layers. For example, the third insulating layer INS3 may have a structure formed by sequentially stacking a first inorganic insulating layer, an organic insulating layer, and a second inorganic insulating layer.

The second contact electrode CNE2 may be provided on the second electrode EL2. In a plan view, the second contact electrode CNE2 may cover or overlap the second electrode EL2. Furthermore, the second contact electrode CNE2 may overlap with the second end EP2 of each of the first light emitting elements LD1 and the first end EP1 of each of the second light emitting elements LD2. The second contact electrode CNE2 and the first contact electrode CNE1 may be made of (or include) the same material, but the disclosure is not limited thereto.

A fourth insulating layer INS4 covering or overlapping the second contact electrode CNE2 may be provided on the second contact electrode CNE2. The fourth insulating layer INS4 may prevent the second contact electrode CNE2 from being exposed to the outside, thus preventing the second contact electrode CNE2 from corroding. The fourth insulating layer INS4 may be formed of (or include) an inorganic insulating layer and/or an organic insulating layer.

An overcoat layer OC may be provided on the fourth insulating layer INS4. The overcoat layer OC may be a planarization layer mitigating a step difference (or height difference) formed by the partition wall PW, the first and second electrodes EL1 and EL2, the first and second contact electrodes CNE1 and CNE2, etc. that are disposed under the overcoat layer OC. The overcoat layer OC may be an encapsulating layer preventing oxygen, water, or the like from penetrating into the light emitting elements LD. In some embodiments, the overcoat layer OC may be omitted.

As described above, predetermined voltages may be respectively applied to the opposite ends EP1 and EP2 of each of the light emitting elements LD through the first electrode EL1 and the second electrode EL2. Hence, each of the light emitting elements LD may emit light by recombining of electron-hole pairs in the active layer 12 of each of the light emitting elements LD. Here, the active layer 12 may emit light having a wavelength range from about 400 nm to about 900 nm.

A first capping layer CPL1_2 and CPL1_2 and a second capping layer CPL2 may be further provided in the emission area 100 of each sub-pixel.

The first capping layer CPL1_2 and CPL1_2 may include a 1-1th capping layer CPL1_1 provided on the 1-1th electrode EL1_1, and a 1-2th capping layer CPL1_2 provided on the 1-2th electrode EL1_2. The second capping layer CPL2 may be provided on the second electrode EL2. The 1-1th capping layer CPL1_1, the 1-2th capping layer CPL1_2, and the second capping layer CPL2 may prevent corresponding electrodes from being damaged by defects, etc. which may occur during a process of fabricating the display device, and may further enhance adhesive force between the corresponding electrodes and the passivation layer PSV.

The 1-1th capping layer CPL1_1, the 1-2th capping layer CPL1_2, and the second capping layer CPL2 may be formed of transparent conductive material such as IZO so as to reduce or minimize loss of light emitted from each of the light emitting elements LD and reflected by the corresponding electrode in the frontal direction of the display device. The 1-1th capping layer CPL1_1, the 1-2th capping layer CPL1_2, and the second capping layer CPL2 may be provided on the same layer and include the same material.

In an embodiment of the disclosure, the non-emission area 200 may be disposed between the respective emission areas 100 of two sub-pixels adjacent to each other in the second direction DR2 (e.g., in the column direction). For example, the non-emission area 200 may be disposed between the emission area 100 of the 1-1th sub-pixel SP1_1 and the emission area 100 of the 1-2th sub-pixel SP1_2 disposed on the first column C1. Hereinafter, for the sake of explanation, the non-emission area 200 which is an area formed between the respective emission areas 100 of two adjacent sub-pixels disposed on the same column in the second direction DR2 may denote a pixel boundary area, and reference numeral "300" will be used to denote the pixel boundary area to prevent confusion with the term "non-emission area 200."

Two connection lines may be provided in a sub-pixel boundary area 300 (hereinafter, referred to as "first sub-pixel boundary area") disposed between the emission area 100 of the 1-1th sub-pixel SP1_1 and the emission area 100 of the 1-2th sub-pixel SP1_2. The two connection lines may include the first connection line CNL1 provided in the 1-1th sub-pixel SP1_1 and the first connection line CNL1 provided in the 1-2th sub-pixel SP1_2.

Hereafter, for the sake of explanation, the first connection line CNL1 of the 1-1th sub-pixel SP1_1 provided in the first sub-pixel boundary area 300 will be referred to as a 1-1th connection line, and the first connection line CNL1 of the 1-2th sub-pixel SP1_2 will be referred to as a 1-2th connection line.

The 1-1th connection line CNL1 and the 1-2th connection line CNL1 may be provided in the first sub-pixel boundary area 300 and be spaced apart from each other by a predetermined distance and thus electrically disconnected and/or physically separated from each other. An imaginary line IL extending in the first direction DR1 may be provided between the 1-1th connection line CNL1 and the 1-2th connection line CNL1. The 1-1th connection line CNL1 and the 1-2th connection line CNL1 may form a mirror symmetric structure based on the imaginary line IL. The 1-1th connection line CNL1 may be disposed at an upper side based on the imaginary line IL in the second direction DR2, and the 1-2th connection line CNL1 may be disposed at a lower side based on the imaginary line IL in the second direction DR2.

The 1-1th connection line CNL1 may be electrically and/or physically connected to the first electrode EL1 of the 1-1th sub-pixel SP1_1. The first electrode EL1 of the 1-1th sub-pixel SP1_1 may diverge upward from the 1-1th connection line CNL1 in the second direction DR2 and thus be provided in the emission area 100 of the 1-1th sub-pixel SP1_1. The 1-1th connection line CNL1 and the first electrode EL1 that are provided in the 1-1th sub-pixel SP1_1 may have a "⊥"-shape in a plan view, but the disclosure is not limited thereto. In the "⊥"-shaped portion, a "—"-shaped portion extending in the first direction DR1 may be the 1-1th connection line CNL1, and a "ll"-shaped portion that diverges upward from the "—"-shaped portion in the second direction DR2 may be the first electrode EL1 of the 1-1th sub-pixel SP1_1.

The 1-2th connection line CNL1 may be electrically and/or physically connected to the first electrode EL1 of the 1-2th sub-pixel SP1_2. The first electrode EL1 of the 1-2th sub-pixel SP1_2 may diverge from the 1-2th connection line CNL1 along the second direction DR2 in a downward direction of the 1-2th connection line CNL1 and thus be provided in the emission area 100 of the 1-2th sub-pixel SP1_2. The 1-2th connection line CNL1 and the first electrode EL1 that are provided in the 1-2th sub-pixel SP1_2 may have a "⊤"-shape in a plan view, but the disclosure is not limited thereto. In the "⊤"-shaped portion, a "—"-shaped portion extending in the first direction DR1 may be the 1-2th connection line CNL1, and a "ll"-shaped portion that diverges downward from the "—"-shaped portion in the second direction DR2 may be the first electrode EL1 of the 1-2th sub-pixel SP1_2.

The second connection line CNL2 electrically connected to the second electrode EL2 of the 1-1th sub-pixel SP1_1 may be disposed at an upper side of the 1-1th connection line CNL1 in the second direction DR2 in a plan view. The second connection line CNL2 electrically connected to the second electrode EL2 of the 1-2th sub-pixel SP1_2 may be disposed at a lower side of the 1-2th connection line CNL1 in the second direction DR2 in a plan view. The second connection line CNL2 electrically connected to the second electrode EL2 of the 1-1th sub-pixel SP1_1 and the second connection line CNL2 electrically connected to the second electrode EL2 of the 1-2th sub-pixel SP1_2 may be spaced apart from each other with the respective emission areas 100 of the 1-1th and 1-2th sub-pixels SP1_1 and SP1_2 interposed therebetween.

As described above, the 1-1th connection line CNL1 and the 1-2th connection line CNL1 that form a mirror symmetric structure based on the imaginary line IL may be provided in the first sub-pixel boundary area 300 between the 1-1th sub-pixel SP1_1 and the 1-2th sub-pixel SP1_2 disposed adjacent to each other in the second direction DR2. The 1-1th connection line CNL1 and the 1-2th connection line CNL1 that are disposed in the first sub-pixel boundary area 300 may transmit the same alignment voltage to the first electrodes EL1 of the corresponding sub-pixels in case that light emitting elements LD are aligned in the corresponding sub-pixels.

For example, the 1-1th connection line CNL1 may supply a first alignment voltage to the first electrode EL1 of the 1-1th sub-pixel SP1_1, and the 1-2th connection line CNL1 may supply the first alignment voltage to the first electrode EL1 of the 1-2th sub-pixel SP1_2. In an embodiment of the disclosure, a ground voltage may be applied to the 1-1th connection line CNL1 and the 1-2th connection line CNL1 as the first alignment voltage, but the disclosure is not limited thereto. In an embodiment, an AC voltage or a DC voltage remaining at a constant voltage level may be applied to the 1-1th connection line CNL1 and the 1-2th connection line CNL1 as the first alignment voltage.

In an embodiment of the disclosure, since the first alignment voltages having the same potential are respectively applied to the 1-1th connection line CNL1 and the 1-2th connection line CNL1, an electric field for aligning the light emitting elements LD is not formed between the 1-1th connection line CNL1 and the 1-2th connection line CNL1 that are provided in the first sub-pixel boundary area 300.

Therefore, the light emitting elements LD are not aligned in the first sub-pixel boundary area 300 that is the non-emission area 200, and the light emitting elements LD may be intensively aligned only in a target area, e.g., in the emission area 100 of each sub-pixel. As a result, in an embodiment of the disclosure, the light emitting elements LD are intensively aligned only in the target area of each sub-pixel, i.e., only in the emission area 100, so that an abnormal alignment defect in which the light emitting elements LD are aligned in an undesired area (e.g., the sub-pixel boundary area 300) may be prevented.

Moreover, since the light emitting elements LD are intensively aligned in the emission area 100 of each sub-pixel, a contact failure between the light emitting elements LD and the electrodes that are electrically connected to the light emitting elements LD may be reduced or minimized. In an embodiment of the disclosure, the electrodes may include the first and second electrodes EL1 and EL2, but the disclosure is not limited thereto. In an embodiment, the electrodes may include the first and second contact electrodes CNE1 and CNE2.

A sub-pixel boundary area 300 may also be provided between the respective emission areas 100 of the 2-1th sub-pixel SP2_1 and the 2-2th sub-pixel SP2_2 disposed adjacent to each other in the second direction DR2. Two first connection lines CNL1 having a mirror symmetric structure may also be provided in the sub-pixel boundary area 300. Likewise, a sub-pixel boundary area 300 may also be provided between the respective emission areas 100 of the 3-1th sub-pixel SP3_1 and the 3-2th sub-pixel SP3_2 disposed adjacent to each other in the second direction DR2. Two first connection lines CNL1 having a mirror symmetric structure may also be provided in the sub-pixel boundary area 300.

In an embodiment of the disclosure, a sub-pixel boundary area 300 (hereinafter, referred to as "second sub-pixel boundary area") may also be provided between the respective emission areas 100 of the 2-2th sub-pixel SP2_2 and the 2-3th sub-pixel SP2_3 disposed adjacent to each other in the second direction DR2. Two connection lines may be provided in the second sub-pixel boundary area 300. The two connection lines may include the second connection line CNL2 provided in the 2-2th sub-pixel SP2_2 and the second connection line CNL2 provided in the 2-3th sub-pixel SP2_3.

Hereafter, for the sake of explanation, the second connection line CNL2 of the 2-2th sub-pixel SP2_2 provided in the second sub-pixel boundary area 300 will be referred to as a 2-1th connection line, and the second connection line CNL2 provided in the 2-3th sub-pixel SP2_3 will be referred to as a 2-2th connection line.

The 2-1th connection line CNL2 and the 2-2th connection line CNL2 may be provided in the second sub-pixel boundary area 300 and be spaced apart from each other by a predetermined distance and thus electrically disconnected and/or physically separated from each other. An imaginary line IL extending in the first direction DR1 may be provided between the 2-1th connection line CNL2 and the 2-2th connection line CNL2. The 2-1th connection line CNL2 and the 2-2th connection line CNL2 may form a mirror symmetric structure based on the imaginary line IL. The 2-1th connection line CNL2 may be disposed at an upper side with respect to the imaginary line IL in the second direction DR2, and the 2-2th connection line CNL2 may be disposed at a lower side with respect to the imaginary line IL in the second direction DR2.

The 2-1th connection line CNL2 may be electrically and/or physically connected to the second electrode EL2 of the 2-2th sub-pixel SP2_2. The second electrode EL2 of the 2-2th sub-pixel SP2_2 may diverge upward from the 2-1th connection line CNL2 in the second direction DR2 and thus be provided in the emission area 100 of the 2-2th sub-pixel SP2_2. The 2-1th connection line CNL2 and the second electrode EL2 that are provided in the 2-2th sub-pixel SP2_2 may have a "⊥"-shape in a plan view, but the disclosure is not limited thereto. In the "⊥"-shaped portion, a "—"-shaped portion extending in the first direction DR1 may be the 2-1th connection line CNL2, and a "l"-shaped portion that diverges upward from the "—"-shaped portion in the second direction DR2 may be the second electrode EL2 of the 2-2th sub-pixel SP2_2.

The 2-2th connection line CNL2 may be electrically and/or physically connected to the second electrode EL2 of the 2-3th sub-pixel SP2_3. The second electrode EL2 of the 2-3th sub-pixel SP2_3 may diverge downward from the 2-2th connection line CNL2 in the second direction DR2 and thus be provided in the emission area 100 of the 2-3th sub-pixel SP2_3. The 2-2th connection line CNL2 and the second electrode EL2 that are provided in the 2-3th sub-pixel SP2_3 may have a "⊤"-shape in a plan view, but the disclosure is not limited thereto. In the "⊤"-shaped portion, a "—"-shaped portion extending in the first direction DR1 may be the 2-2th connection line CNL2, and a "l"-shaped portion that diverges downward from the "—"-shaped portion in the second direction DR2 may be the second electrode EL2 of the 2-3th sub-pixel SP2_3.

The first connection line CNL1 electrically connected to the first electrode EL1 of the 2-2th sub-pixel SP2_2 may be disposed at an upper side of the 2-1th connection line CNL2 in the second direction DR2 in a plan view. The first connection line CNL1 electrically connected to the first electrode EL1 of the 2-3th sub-pixel SP2_3 may be disposed at a lower side of the 2-2th connection line CNL2 in the second direction DR2 in a plan view. The first connection line CNL1 electrically connected to the first electrode EL1 of the 2-2th sub-pixel SP2_2 and the first connection line CNL1 electrically connected to the first electrode EL1 of the 2-3th sub-pixel SP1_2 may be spaced apart from each other with the respective emission areas 100 of the 2-2th and 2-3th sub-pixels SP2_2 and SP2_3 interposed therebetween.

As described above, the 2-1th connection line CNL2 and the 2-2th connection line CNL2 that form a mirror symmetric structure with respect to the imaginary line IL may be provided in the second sub-pixel boundary area 300 between the 2-2th sub-pixel SP2_2 and the 2-3th sub-pixel SP2_3 disposed adjacent to each other in the second direction DR2. The 2-1th connection line CNL2 and the 2-2th connection line CNL2 may transmit the same alignment voltage to the second electrodes EL2 of the corresponding sub-pixels when light emitting elements LD are aligned in the corresponding sub-pixels.

For example, the 2-1th connection line CNL2 may supply a second alignment voltage to the second electrode EL2 of the 2-2th sub-pixel SP2_2, and the 2-2th connection line CNL2 may supply the second alignment voltage to the second electrode EL2 of the 2-3th sub-pixel SP2_3. In an embodiment of the disclosure, an AC voltage or a DC voltage remaining at a constant voltage level may be applied to the 2-1th connection line CNL2 and the 2-2th connection line CNL2 as the second alignment voltage, but the disclosure is not limited thereto. In an embodiment, the ground voltage may be applied to the 2-1th connection line CNL2 and the 2-2th connection line CNL2.

In an embodiment of the disclosure, since the second alignment voltages having the same potential are respectively applied to the 2-1th connection line CNL2 and the 2-2th connection line CNL2, an electric field for aligning the light emitting elements LD is not formed between the 2-1th connection line CNL2 and the 2-2th connection line CNL2 that are provided in the second sub-pixel boundary area 300. Therefore, the light emitting elements LD are not aligned in the second sub-pixel boundary area 300 that is the non-emission area 200, and the light emitting elements LD may be intensively aligned only in a target area, e.g., in the emission area 100 of each sub-pixel. As a result, in an embodiment of the disclosure, the light emitting elements LD are intensively aligned only in the target area of each sub-pixel, i.e., only in the emission area 100, so that an abnormal alignment defect in which the light emitting elements LD are aligned in an undesired area (e.g., the sub-pixel boundary area 300) may be prevented.

A sub-pixel boundary area 300 may also be provided between the respective emission areas 100 of the 1-2th sub-pixel SP1_2 and the 1-3th sub-pixel SP1_3 disposed adjacent to each other in the second direction DR2. Two second connection lines CNL2 having a mirror symmetric structure may also be provided in the sub-pixel boundary area 300. Likewise, a sub-pixel boundary area 300 may also be provided between the respective emission areas 100 of the 3-2th sub-pixel SP3_2 and the 3-3th sub-pixel SP3_3 disposed adjacent to each other in the second direction DR2. Two second connection lines CNL2 having a mirror symmetric structure may also be provided in the sub-pixel boundary area 300.

FIGS. 6A to 6F are schematic plan views sequentially illustrating a method of fabricating the display device of FIG. 4.

Referring to FIGS. TA, 2, 4, 5, and 6A, the pixel circuit layer PCL of each sub-pixel is formed on the substrate SUB. Each sub-pixel may include the emission area 100 and the non-emission area 200. The sub-pixel boundary area 300 that is a non-emission area 200 is disposed between two sub-pixels disposed adjacent to each other in the second direction DR2.

The pixel circuit layer PCL may further include the first and second transistors T1 and T2, the driving voltage line DVL, and the passivation layer PSV. The passivation layer PSV may include a first contact hole CH1 which exposes a portion of the drain electrode DE of the first transistor T1, and a second contact hole CH2 which exposes a portion of the driving voltage line DVL.

Referring to FIGS. TA, 2, 4, 5, 6A, and 6B, the partition wall PW is formed on the passivation layer PSV in the emission area 100 of each sub-pixel.

The partition wall PW may be spaced by a predetermined distance apart from a partition wall PW disposed adjacent thereto on the passivation layer PSV. The partition wall PW may include an inorganic insulating layer formed of an inorganic material or an organic insulating layer formed of an organic material.

A metal layer MTL, and the first and second electrodes EL1 and EL2 are formed on the passivation layer PSV including the partition wall PW.

The metal layer MTL, and the first and second electrodes EL1 and EL2 may include the same material, and each may be formed of (or include) a single layer or multiple layers. In the case where the metal layer MTL, and the first and second electrodes EL1 and EL2 each are formed of multiple layers, each of the metal layer MTL, and the first and second electrodes EL1 and EL2 may have a structure formed by successively stacking a first conductive layer formed of ITO, a second conductive layer formed of Ag, and a third conductive layer formed of ITO.

The first and second electrodes EL1 and EL2 and the metal layer MTL may be integral with each other. The first and second electrodes EL1 and EL2 may be disposed in portions of the emission area 100 and the non-emission area 200 of each sub-pixel. The metal layer MTL may be disposed in the non-emission area 200 of each sub-pixel.

The metal layer MTL may include a first metal layer MTL1 which extends in the first direction DR1 and is electrically and/or physically connected with the first electrode EL1, and a second metal layer MTL2 which is parallel to the extension direction of the first metal layer MTL1 and is electrically and/or physically connected to the second electrode EL2.

The first electrode EL1 may diverge from the first metal layer MTL1 into the emission area 100 of each sub-pixel in the second direction DR2. The first electrode EL1 may include a 1-1th electrode EL1_1 and a 1-2th electrode EL1_2 which diverge from the first metal layer MTL1 into the emission area 100 of each sub-pixel. The second electrode EL2 may diverge from the second metal layer MTL2 into the emission area 100 of each sub-pixel in the second direction DR2. The 1-1th electrode EL1_1, the second electrode EL2, and the 1-2th electrode EL1_2 may be spaced apart from each other at regular intervals. Particularly, the first electrode EL1 and the second electrode EL2 may be electrically disconnected and/or physically separated from each other.

A portion of the first metal layer MTL1 may be removed after the alignment of the light emitting elements LD in each sub-pixel has been completed. Detailed description of this process will be made below with reference to FIG. 6D.

The sub-pixel boundary area 300 is disposed between the respective emission areas 100 of two sub-pixels disposed adjacent to each other in the second direction DR2. Two metal layers MTL may be disposed in the sub-pixel boundary area 300. The two metal layers MTL may form a mirror symmetric structure based on an imaginary line IL extending in the first direction DR1.

The two metal layers MTL disposed in the sub-pixel boundary area 300 may include the first metal layer MTL1 that is connected to the first electrode EL1 of one of the two sub-pixels adjacent to each other in the second direction DR2, and the first metal layer MTL that is connected to the first electrode EL1 of the other sub-pixel. In an embodiment, the two metal layers MTL disposed in the sub-pixel boundary area 300 may include the second metal layer MTL2 that is connected to the second electrode EL2 of one of the two sub-pixels adjacent to each other in the second direction DR2, and the second metal layer MTL2 that is connected to the second electrode EL2 of the other sub-pixel.

Referring to FIGS. 1A, 2, 4, 5, and 6A to 6C, a first insulating material layer (not illustrated) is formed on the first and second electrodes EL1 and EL2. The first insulating material layer may be formed of an inorganic insulating layer including an inorganic material, or an organic insulating layer including an organic material.

Thereafter, an electric field is formed between the first electrode EL1 and the second electrode EL2 by respectively applying corresponding alignment voltages to the first and second electrodes EL1 and EL2 of each sub-pixel through the first and second metal layers MTL1 and MTL2. In the case where DC power or AC power having predetermined voltage and period is repeatedly applied several times to each of the first and second electrodes EL1 and EL2 through the first and second metal layers MTL1 and MTL2, an electric field may be formed between the first and second electrodes EL1 and EL2 by a difference in potential between the first and second electrodes EL1 and EL2.

Here, alignment voltages having the same potential may be respectively applied to the two metal layers disposed in the sub-pixel boundary area 300. For example, in the case where two first metal layers MTL1 connected to the first electrode EL1 of each of two sub-pixels that are adjacent to each other in the second direction DR2 are disposed in the sub-pixel boundary area 300, the same alignment voltage may be applied to each of the two first metal layers MTL1. In an embodiment, in the case where two second metal layers MTL2 connected to the second electrode EL2 of each of two sub-pixels that are adjacent to each other in the second direction DR2 are disposed in the sub-pixel boundary area 300, the same alignment voltage may be applied to each of the two second metal layers MTL2.

Since the same alignment voltage is applied to the two metal layers MTL disposed in the sub-pixel boundary area 300, there is no difference in potential between the two metal layers MTL. Hence, an electric field may not be formed between the two metal layers MTL.

After an electric field is formed between the first electrode EL1 and the second electrode EL2 that are provided in the emission area 100 of each sub-pixel, light emitting elements LD are supplied by an inkjet printing method or the like. For example, the light emitting elements LD may be supplied onto the passivation layer PSV of the emission area 100 of each sub-pixel by disposing a nozzle over the passivation layer PSV and dropping a solvent including the light emitting elements LD onto the passivation layer PSV through the nozzle. The solvent may be one of acetone, water, alcohol, and toluene, but the disclosure is not limited thereto. For example, the solvent may include material which may be vaporized at the room temperature or by heat.

Furthermore, the solvent may have the form of ink or paste. A method of supplying the light emitting elements LD is not limited to the foregoing method. The method of supplying the light emitting elements LD may be changed. Subsequently, the solvent may be removed.

If the light emitting elements LD are supplied onto the passivation layer PSV, self-alignment of the light emitting elements LD may be induced by the electric field formed between the first electrode EL1 and the second electrode EL2. Hence, the light emitting elements LD may be aligned between the first electrode EL1 and the second electrode EL2. In other words, the light emitting elements LD may be intensively aligned in a target area, e.g., the emission area 100 of each sub-pixel.

In an embodiment of the disclosure, the light emitting elements LD each may be aligned on the first insulating material layer between the first electrode EL1 and the second electrode EL2.

Referring to FIGS. TA, 2, 4, 5, and 6A to 6D, after the alignment of the light emitting elements LD has been completed, the first connection line CNL1 and the second connection line CNL2 are respectively formed by removing respective portions of the first metal layer MTL1 and the second metal layer MTL2 from each sub-pixel.

In detail, the first connection line CNL1 may be formed by removing a portion of the first metal layer MTL1 between the sub-pixels disposed adjacent to each other in the first direction DR1 so that each sub-pixel may be operated independently from the sub-pixel adjacent thereto. In an example of removing a portion of the first metal layer MTL1, an etching method may be used, but the disclosure is not limited thereto. The first connection line CNL1 may extend in the first direction DR1 and may be provided in the non-emission area 200 of each sub-pixel. The first connection line CNL1 may be electrically and/or physically connected to the first electrode EL1 of each sub-pixel.

Simultaneously, the second connection line CNL2 electrically disconnected from an alignment line (not illustrated) disposed on the non-display area NDA of the substrate SUB may be formed by partially removing at least a portion of the second metal layer MTL2. The alignment line disposed on the non-display area NDA may be a line configured to transmit, from an external power supply, an alignment voltage corresponding to each of the first and second metal layers MTL1 and MTL2. The second connection line CNL2 may extend in the first direction DR1 and may be provided in the non-emission area 200 of each sub-pixel. The second connection line CNL2 may be electrically and/or physically connected to the second electrode EL2 of each sub-pixel. Furthermore, the second connection line CNL2 may be provided in common to adjacent sub-pixels.

Through the above-mentioned fabricating process, two connection lines may be disposed in the sub-pixel boundary area 300 corresponding to the non-emission area 200 between two sub-pixels adjacent to each other in the second direction DR2. The two connection lines may form a mirror symmetric structure in the sub-pixel boundary area 300 with respect to an imaginary line IL extending in the first direction DR1.

For example, the two connection lines disposed in the sub-pixel boundary area 300 may include the first connection line CNL1 that is electrically connected to the first electrode EL1 of one sub-pixel of the two sub-pixels adjacent to each other in the second direction DR2, and the first connection line CNL1 that is electrically connected to the first electrode EL1 of the other sub-pixel of the two sub-pixels. In an embodiment, the two connection lines disposed in the sub-pixel boundary area 300 may include the second connection line CNL2 that is electrically connected to the second electrode EL2 of one sub-pixel of the two sub-pixels adjacent to each other in the second direction DR2, and the second connection line CNL2 that is connected to the second electrode EL2 of the other sub-pixel of the two sub-pixels.

After a second insulating material layer (not illustrated) is formed on the passivation layer PSV on which the first and second connection lines CNL1 and CNL2, etc. are provided, the second insulating layer INS2 is formed in the emission area 100 of each sub-pixel by patterning the second insulating material layer by using a mask. The second insulating layer INS2 may allow the opposite ends EP1 and EP2 of each of the light emitting elements LD aligned in each sub-pixel to be exposed.

The first insulating material layer may also be patterned through the foregoing mask process, so that the first insulating layer INS1 may be formed in the emission area 100 of each sub-pixel. In an embodiment, the first and second insulating layers INS1 and INS2 may be patterned and formed together through the mask process of forming a third insulating layer INS3 to be described below.

Referring to FIGS. 1A, 2, 4, 5, and 6A to 6E, the first contact electrode CNE1 is formed in the emission area 100 of each sub-pixel.

The first contact electrode CNE1 may be formed on the first electrode EL1 and electrically connected with the first electrode EL1. Furthermore, the first contact electrode CNE1 may be formed on one end of the opposite ends EP1 and EP2 of each of the light emitting elements LD and electrically connected with the one end of each of the light emitting elements LD. Therefore, the first electrode EL1 and the one end of each of the light emitting elements LD may be electrically connected with each other through the first contact electrode CNE1.

The first contact electrode CNE1 may include a 1-1th contact electrode CNE1_1 provided on the 1-1th electrode EL1_1, and a 1-2th contact electrode CNE1_2 provided on the 1-2th electrode EL1_2.

Subsequently, after a third insulating material layer (not illustrated) is deposited on the passivation layer PSV on which the first contact electrode CNE1 is provided, the third insulating layer INS3 overlapping the first contact electrode CNE1 is formed using a mask. The first contact electrode CNE1 may not be exposed to the outside by the third insulating layer INS3. The second electrode EL2 and the other end of the opposite ends EP1 and EP2 of each of the light emitting elements LD may be exposed to the outside.

Referring to FIGS. TA, 2, 4, 5, and 6A to 6F, the second contact electrode CNE2 is formed in the emission area 100 of each sub-pixel.

The second contact electrode CNE2 may be provided on the second electrode EL2 that is exposed to the outside and may be electrically and/or physically connected with the second electrode EL2. Furthermore, the second contact electrode CNE2 may be formed on the other end of each of the light emitting elements LD that is exposed to the outside and may be electrically connected with the other end of each of the light emitting elements LD. Therefore, the second electrode EL2 and the other end of each of the light emitting elements LD may be electrically connected with each other through the second contact electrode CNE2.

Subsequently, the fourth insulating layer INS4 is formed on the second contact electrode CNE2. The fourth insulating layer INS4 may include an inorganic insulating layer made of an inorganic material, or an organic insulating layer made of (or including) an organic material. Subsequently, the overcoat layer OC is formed on the fourth insulating layer INS4.

Figure 7:
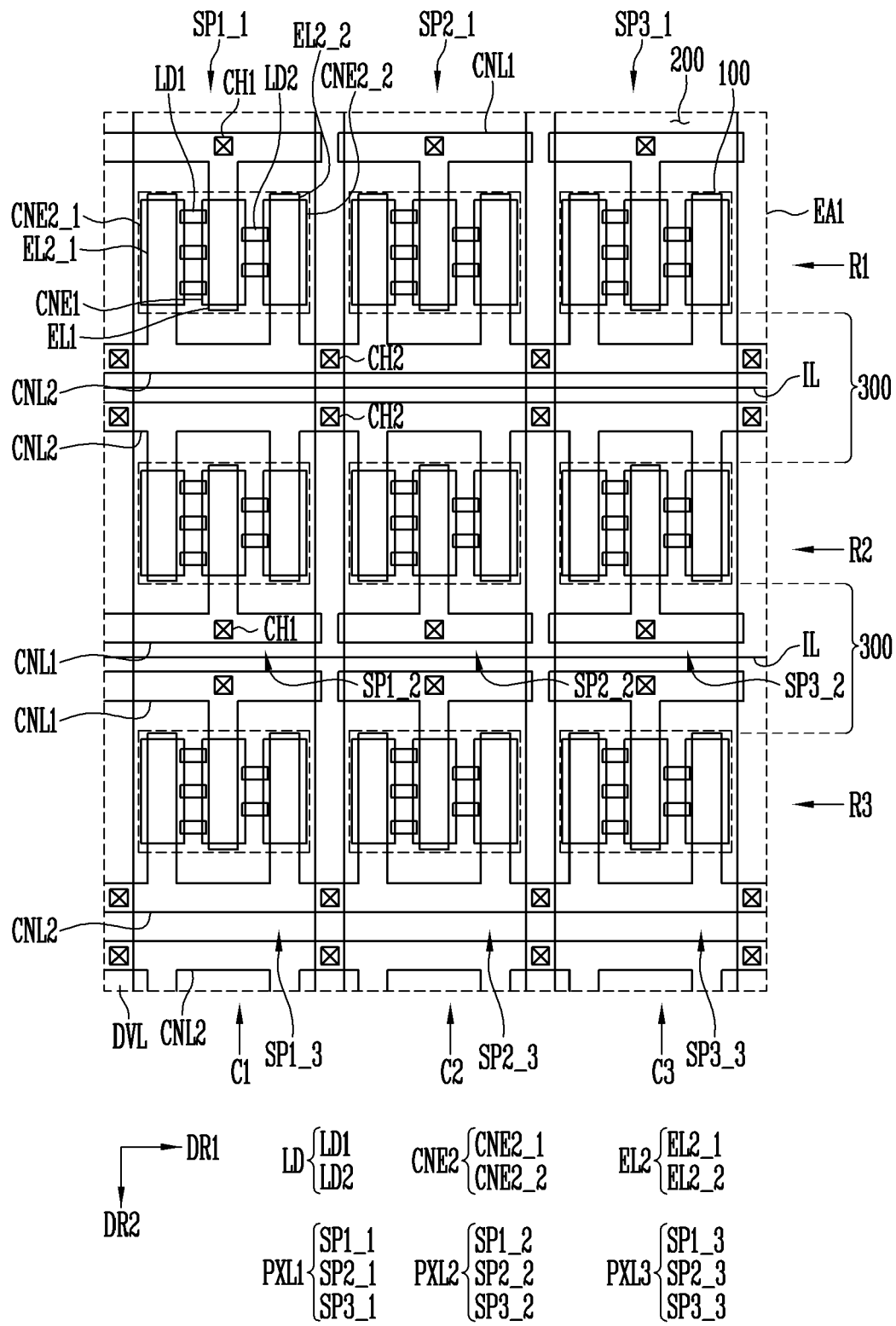
FIG. 7 illustrates a display device in accordance with an embodiment of the disclosure, and is a schematic enlarged plan view corresponding to area EA1 of FIG. 2.

FIG. 7 illustrates a display device in accordance with an embodiment of the present disclosure, and is a schematic enlarged plan view corresponding to area EA1 in FIG. 2.

The configuration of the display device illustrated in FIG. 7, other than the features that a second electrode diverging from a second connection line includes a 2-1th electrode and a 2-2th electrode and a first electrode diverging from a first connection line includes a first electrode, may be substantially identical or similar to that of the display device of FIG. 4.

Therefore, with regard to the display device of FIG. 7, the following description will be focused on differences from that of the foregoing embodiments, to avoid repetitive explanation. Components which are not separately explained in the following description of the embodiment comply with that of the foregoing embodiments. The same reference numeral will be used to denote the same component, and a similar reference numeral will be used to denote a similar component.

Referring to FIGS. 1A, 2, and 7, the display device in accordance with an embodiment of the disclosure may include a substrate SUB on which first to third pixels PXL1, PXL2, and PXL3 are provided. The first to third pixels PXL1, PXL2, and PXL3 may be disposed adjacent to each other in the second direction DR2 on the substrate SUB. In an embodiment, each of the first to third pixels PXL1, PXL2, and PXL3 may include at least one sub-pixel.

The first pixel PXL1 may include a 1-1th sub-pixel SP1_1, a 2-1th sub-pixel SP2_1, and a 3-1th sub-pixel SP3_1. The second pixel PXL2 may include a 1-2th sub-pixel SP1_2, a 2-2th sub-pixel SP2_2, and a 3-2th sub-pixel SP3_2. The third pixel PXL3 may include a 1-3th sub-pixel SP1_3, a 2-3th sub-pixel SP2_3, and a 3-3th sub-pixel SP3_3.

Each sub-pixel may include the substrate SUB, a pixel circuit layer PCL (refer to the pixel circuit layer PCL of FIG. 5) provided on the substrate SUB, and a display element layer DPL (refer to the display element layer DPL of FIG. 5) provided on the pixel circuit layer PCL.

In an embodiment of the disclosure, a sub-pixel boundary area 300 is disposed between the emission areas 100 of two sub-pixels disposed adjacent to each other in the second direction DR2. Two connection lines may be provided in the sub-pixel boundary area 300. For example, two connection lines may be provided in a sub-pixel boundary area 300 (hereinafter, referred to as "first sub-pixel boundary area") disposed between the emission area 100 of the 1-1th sub-pixel SP1_1 and the emission area 100 of the 1-2th sub-pixel SP1_2. The two connection lines may include a second connection line CNL2 (hereinafter, referred to as "2-1th connection line") provided in the 1-1th sub-pixel SP1_1, and a second connection line CNL2 (hereinafter, referred to as "2-2th connection line") provided in the 1-2th sub-pixel SP1_2.

The 2-1th connection line CNL2 and the 2-2th connection line CNL2 may be provided in the first sub-pixel boundary area 300 and be spaced apart from each other by a predetermined distance and thus electrically disconnected and/or physically separated from each other. An imaginary line IL extending in the first direction DR1 may be provided between the 2-1th connection line CNL2 and the 2-2th connection line CNL2. The 2-1th connection line CNL2 and the 2-2th connection line CNL2 may form a mirror symmetric structure based on the imaginary line IL. The 2-1th connection line CNL2 may be disposed at an upper side with respect to the imaginary line IL in the second direction DR2, and the 2-2th connection line CNL2 may be disposed at a lower side with respect to the imaginary line IL in the second direction DR2.

The 2-1th connection line CNL2 may be electrically and/or physically connected to the second electrode EL2 of the 1-1th sub-pixel SP1_1. The second electrode EL2 of the 1-1th sub-pixel SP1_1 may include a 2-1th electrode EL2_1 and a 2-2th electrode EL2_2 which diverge upward from the 2-1th connection line CNL2 provided on the first sub-pixel boundary area 300 in the second direction DR2. The 2-1th and 2-2th electrodes EL2_1 and EL2_2 may be provided in the emission area 100 of the 1-1th sub-pixel SP1_1.

The 2-1th connection line CNL2 and the second electrode EL2 that are provided in the 1-1th sub-pixel SP1_1 may have a "⊥"-shape in a plan view, but the disclosure is not limited thereto. In the "⊥"-shaped portion, a "—"-shaped portion extending in the first direction DR1 may be the 2-1th connection line CNL2, and "11"-shaped portions that diverge upward from the "—"-shaped portion in the second direction DR2 may be the 2-1th electrode EL2_1 and the 2-2th electrode EL2_2.

The 2-2th connection line CNL2 may be electrically and/or physically connected to the second electrode EL2 of the 1-2th sub-pixel SP1_2. The second electrode EL2 of the 1-2th sub-pixel SP1_2 may include 2-1th and 2-2th electrodes EL2_1 and EL2_2 which diverge downward from the 2-2th connection line CNL2 provided in the first sub-pixel boundary area 300 in the second direction DR2. The 2-1th and 2-2th electrodes EL2_1 and EL2_2 may be provided in the emission area 100 of the 1-2th sub-pixel SP1_2.

The 2-2th connection line CNL2 and the second electrode EL2 that are provided in the 1-2th sub-pixel SP1_2 may have a "π"-shape in a plan view, but the disclosure is not limited thereto. In the "π"-shaped portion, a "—"-shaped portion extending in the first direction DR1 may be the 2-2th connection line CNL2, and "ll"-shaped portions that diverge downward from the "—"-shaped portion in the second direction DR2 may be the 2-1th and 2-2th electrodes EL2_1 and EL2_2.

The first connection line CNL1 electrically connected to the first electrode EL1 of the 1-1th sub-pixel SP1_1 may be disposed at an upper side of the 2-1th connection line CNL2 in the second direction DR2 in a plan view. The first connection line CNL1 electrically connected to the first electrode EL1 of the 1-2th sub-pixel SP1_2 may be disposed at a lower side of the 2-2th connection line CNL2 in the second direction DR2 in a plan view. The first connection line CNL1 electrically connected to the first electrode EL1 of the 1-1th sub-pixel SP1_1 and the first connection line CNL1 electrically connected to the first electrode EL1 of the 1-2th sub-pixel SP1_2 may be spaced apart from each other with the respective emission areas 100 of the 1-1th and 1-2th sub-pixels SP1_1 and SP1_2 interposed therebetween.

The 2-1th connection line CNL2 and the 2-2th connection line CNL2 may transmit the same alignment voltage to the second electrodes EL2 of the corresponding sub-pixels in case that light emitting elements LD are aligned in the corresponding sub-pixels. The 2-1th connection line CNL2 may extend to the sub-pixels SP2_1 and SP3_1 adjacent to the 1-1th sub-pixel SP1_1 in the first direction DR1. The 2-2th connection line CNL2 may extend to the sub-pixels SP2_2 and SP3_2 adjacent to the 1-2th sub-pixel SP1_2 in the first direction DR1.

A sub-pixel boundary area 300 may also be provided between the respective emission areas 100 of the 2-1th sub-pixel SP2_1 and the 2-2th sub-pixel SP2_2 disposed adjacent to each other in the second direction DR2. Two second connection lines CNL2 having a mirror symmetric structure may also be provided in the sub-pixel boundary area 300. Likewise, a sub-pixel boundary area 300 may also be provided between the respective emission areas 100 of the 3-1th sub-pixel SP3_1 and the 3-2th sub-pixel SP3_2 disposed adjacent to each other in the second direction DR2. Two second connection lines CNL2 having a mirror symmetric structure may also be provided in the sub-pixel boundary area 300.

In an embodiment of the disclosure, a sub-pixel boundary area 300 (hereinafter, referred to as "second sub-pixel boundary area") may also be provided between the respective emission areas 100 of the 2-2th sub-pixel SP2_2 and the 2-3th sub-pixel SP2_3 disposed adjacent to each other in the second direction DR2. Two connection lines may be provided in the second sub-pixel boundary area 300. The two connection lines may include a first connection line CNL1 (hereinafter, referred to as "1-1th connection line") provided in the 2-2th sub-pixel SP2_2, and a first connection line CNL1 (hereinafter, referred to as "1-2th connection line") provided in the 2-3th sub-pixel SP2_3.

An imaginary line IL extending in the first direction DR1 may be provided between the 1-1th connection line CNL1 and the 1-2th connection line CNL1. The 1-1th connection line CNL1 and the 1-2th connection line CNL1 may form a mirror symmetric structure with respect to the imaginary line IL. The 1-1th connection line CNL1 may be disposed at an upper side with respect to the imaginary line IL in the second direction DR2, and the 1-2th connection line CNL1 may be disposed at a lower side with respect to the imaginary line IL in the second direction DR2.

The 1-1th connection line CNL1 may be electrically and/or physically connected to the first electrode EL1 of the 2-2th sub-pixel SP2_2. The first electrode EL1 of the 2-2th sub-pixel SP2_2 may diverge upward from the 1-1th connection line CNL1 provided in the second sub-pixel boundary area 300 in the second direction DR2 and thus be provided in the emission area 100 of the 2-2th sub-pixel SP2_2. The 1-1th connection line CNL1 and the first electrode EL1 that are provided in the 2-2th sub-pixel SP2_2 may have a "⊥"-shape in a plan view, but the disclosure is not limited thereto. In the "⊥"-shaped portion, a "—"-shaped portion extending in the first direction DR1 may be the 1-1th connection line CNL1, and a "l"-shaped portion that diverges upward from the "—"-shaped portion in the second direction DR2 may be the first electrode EL1 of the 2-2th sub-pixel SP2_2.

The 1-2th connection line CNL1 may be electrically and/or physically connected to the first electrode EL1 of the 2-3th sub-pixel SP2_3. The first electrode EL1 of the 2-3th sub-pixel SP2_3 may diverge downward from the 1-2th connection line CNL1 provided in the second sub-pixel boundary area 300 in the second direction DR2 and thus be provided in the emission area 100 of the 2-3th sub-pixel SP2_3. The 1-2th connection line CNL1 and the first electrode EL1 that are provided in the 2-3th sub-pixel SP2_3 may have a "⊤"-shape in a plan view, but the disclosure is not limited thereto. In the "⊤"-shaped portion, a "—"-shaped portion extending in the first direction DR1 may be the 1-2th connection line CNL1, and a "l"-shaped portion that diverges downward from the "—"-shaped portion in the second direction DR2 may be the first electrode EL1 of the 2-3th sub-pixel SP2_3.

The second connection line CNL2 electrically connected to the second electrode EL2 of the 2-2th sub-pixel SP2_2 may be disposed at an upper side of the 1-1th connection line CNL1 in the second direction DR2 in a plan view. The second connection line CNL2 electrically connected to the second electrode EL2 of the 2-3th sub-pixel SP2_3 may be disposed at a lower side of the 1-2th connection line CNL1 in the second direction DR2 in a plan view. The second connection line CNL2 electrically connected to the second electrode EL2 of the 2-2th sub-pixel SP2_2 and the second connection line CNL2 electrically connected to the second electrode EL2 of the 2-3th sub-pixel SP2_3 may be spaced apart from each other with the respective emission areas 100 of the 2-2th and 2-3th sub-pixels SP2_2 and SP2_3 interposed therebetween.

The 1-1th connection line CNL1 and the 1-2th connection line CNL1 may transmit the same alignment voltage to the first electrodes EL1 of the corresponding sub-pixels in case that light emitting elements LD are aligned in the corresponding sub-pixels.

The sub-pixel boundary area 300 may also be provided between the respective emission areas 100 of the 1-2th sub-pixel SP1_2 and the 1-3th sub-pixel SP1_3 disposed adjacent to each other in the second direction DR2. Two first connection lines CNL1 having a mirror symmetric structure may also be provided in the sub-pixel boundary area 300. Likewise, a sub-pixel boundary area 300 may also be provided between the respective emission areas 100 of the 3-2th sub-pixel SP3_2 and the 3-3th sub-pixel SP3_3 disposed adjacent to each other in the second direction DR2. Two first connection lines CNL1 having a mirror symmetric structure may also be provided in the sub-pixel boundary area 300.

Figure 8:
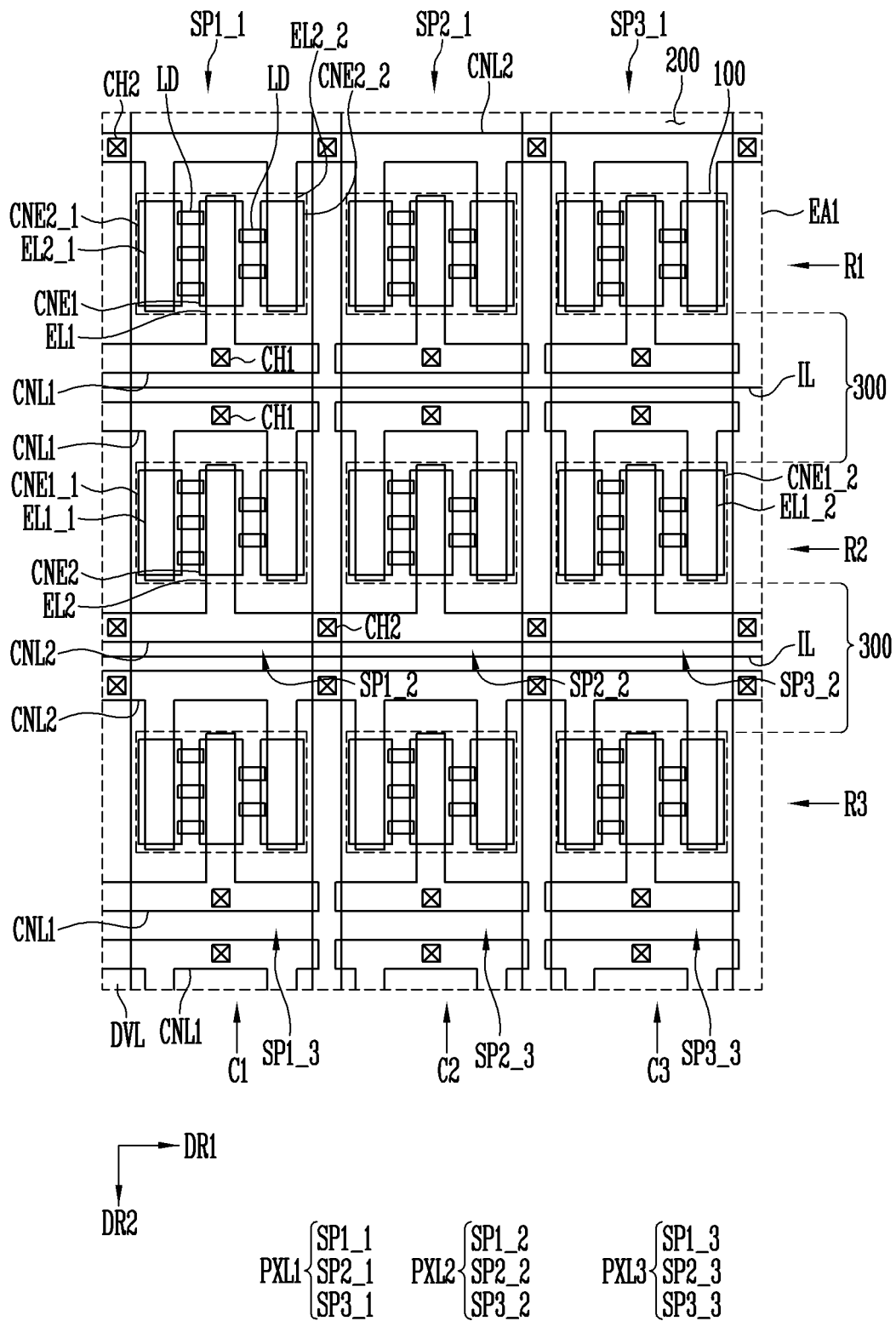
FIGS. 8 and 9 illustrate a display device in accordance with an embodiment of the disclosure, and is a schematic enlarged plan views corresponding to area EA1 of FIG. 2.
Figure 9:
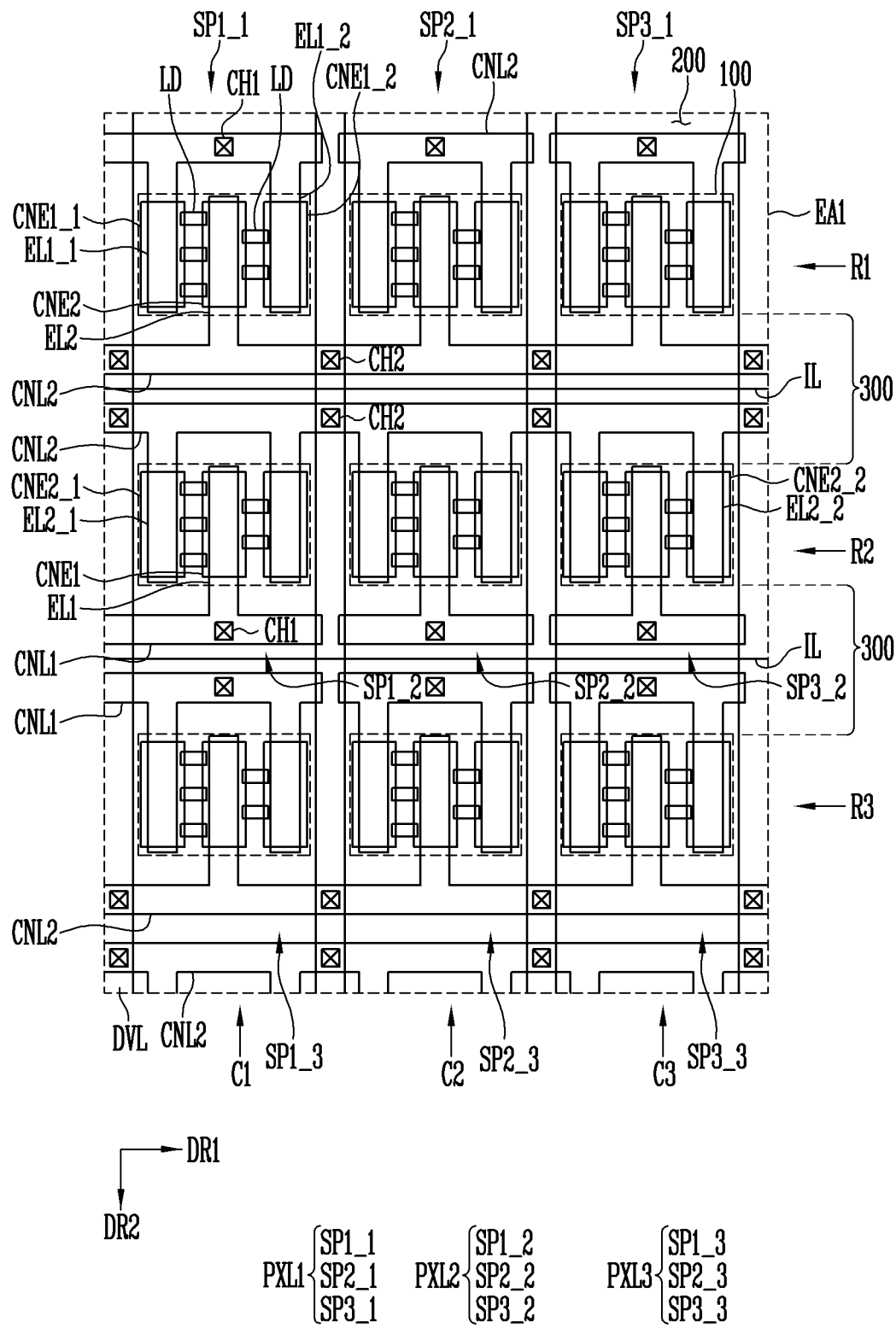

FIGS. 8 and 9 schematically illustrate a display device in accordance with an embodiment of the disclosure and are a schematic enlarged plan views corresponding to area EA1 of FIG. 2.

The configuration of the display device illustrated in FIGS. 8 and 9, other than the fact that two connection lines disposed in a sub-pixel boundary area between two sub-pixels disposed adjacent to each other in the second direction do not form a symmetric structure, may be substantially identical or similar to that of the display device of FIG. 4.

With regard to the display device of FIGS. 8 and 9, the following description will be focused on differences from that of the foregoing embodiments to avoid repetitive explanation. Components which are not separately explained in the following description of the embodiment may comply with that of the foregoing embodiments. The same reference numeral will be used to designate the same component, and a similar reference numeral will be used to designate a similar component.

Referring to FIGS. 1A, 2, 8, and 9, the display device in accordance with an embodiment of the disclosure may include a substrate SUB on which first to third pixels PXL1, PXL2, and PXL3 are provided. The first to third pixels PXL1, PXL2, and PXL3 may be disposed adjacent to each other in the second direction DR2 on the substrate SUB. In an embodiment, each of the first to third pixels PXL1, PXL2, and PXL3 may include at least one sub-pixel.

The first pixel PXL1 may include a 1-1th sub-pixel SP1_1, a 2-1th sub-pixel SP2_1, and a 3-1th sub-pixel SP3_1. The second pixel PXL2 may include a 1-2th sub-pixel SP1_2, a 2-2th sub-pixel SP2_2, and a 3-2th sub-pixel SP3_2. The third pixel PXL3 may include a 1-3th sub-pixel SP1_3, a 2-3th sub-pixel SP2_3, and a 3-3th sub-pixel SP3_3.

Each sub-pixel may include the substrate SUB, a pixel circuit layer PCL (refer to the pixel circuit layer PCL of FIG. 5) provided on the substrate SUB, and a display element layer DPL (refer to the display element layer DPL of FIG. 5) provided on the pixel circuit layer PCL.

In an embodiment of the disclosure, a sub-pixel boundary area 300 is disposed between the emission areas 100 of two sub-pixels disposed adjacent to each other in the second direction DR2. Two connection lines may be provided in the sub-pixel boundary area 300.

For example, two connection lines may be provided in the sub-pixel boundary area 300 (hereinafter, referred to as "first sub-pixel boundary area") disposed between the emission area 100 of the 1-1th sub-pixel SP1_1 and the emission area 100 of the 1-2th sub-pixel SP1_2.

As illustrated in FIG. 8, the two connection lines may include the first connection line CNL1 provided in the 1-1th sub-pixel SP1_1 and the first connection line CNL1 provided in the 1-2th sub-pixel SP1_2. The first connection line CNL1 provided in the 1-1th sub-pixel SP1_1 and the first connection line CNL1 provided in the 1-2th sub-pixel SP1_2 may be spaced apart from each other by a predetermined distance with an imaginary line IL interposed therebetween and extending in the first direction DR1 and may be electrically disconnected and/or physically separated from each other. The first connection line CNL1 provided in the 1-1th sub-pixel SP1_1 and the first connection line CNL1 provided in the 1-2th sub-pixel SP1_2 may transmit the same alignment voltage to the first electrodes EL1 of the corresponding sub-pixels when light emitting elements LD are aligned in the corresponding sub-pixels.

The first connection line CNL1 provided in the 1-1th sub-pixel SP1_1 may be disposed at an upper side with respect to the imaginary line IL in the second direction DR2. The first connection line CNL1 provided in the 1-2th sub-pixel SP1_2 may be disposed at a lower side with respect to the imaginary line IL.

The first connection line CNL1 provided in the 1-1th sub-pixel SP1_1 may be electrically and/or physically connected to the first electrode EL1 of the 1-1th sub-pixel SP1_1. The first electrode EL1 of the 1-1th sub-pixel SP1_1 may diverge upward from the first connection line CNL1 provided in the corresponding sub-pixel in the second direction DR2 and thus be provided in the emission area 100 of the 1-1th sub-pixel SP1_1.

The first connection line CNL1 provided in the 1-2th sub-pixel SP1_2 may be electrically and/or physically connected to the first electrode EL1 of the corresponding sub-pixel. The first electrode EL1 of the 1-2th sub-pixel SP1_2 may include a 1-1th electrode EL1_1 and a 1-2th electrode EL1_2 which diverge downward from the first connection line CNL1 provided in the corresponding sub-pixel in the second direction DR2. The 1-1th electrode EL1_1 and the 1-2th electrode EL1_2 may be provided in the emission area 100 of the 1-2th sub-pixel SP1_2.

As illustrated in FIG. 8, two first connection lines CNL1 may be provided in the sub-pixel boundary area 300 between two sub-pixels adjacent to each other in the second direction DR2, i.e., between the 1-1th and 1-2th sub-pixels SP1_1 and SP1_2 and may be electrically and/or physically connected to the first electrodes EL1 of the corresponding sub-pixels. In this case, two second connection lines CNL2 may be provided in the sub-pixel boundary area 300 between the 2-2th sub-pixel SP2_2 and the 2-3th sub-pixel SP2_3 that are adjacent to each other in the second direction DR2 and may be electrically and/or physically connected to the second electrodes EL2 of the corresponding sub-pixels.

In an embodiment, as illustrated in FIG. 9, two second connection lines CNL2 may be provided in the sub-pixel boundary area 300 between the 1-1th sub-pixel SP1_1 and the 1-2th sub-pixel SP1_2 that are adjacent to each other in the second direction DR2. The two second connection lines CNL2 may include the second connection line CNL2 provided in the 1-1th sub-pixel SP1_1, and the second connection line CNL2 provided in the 1-2th sub-pixel SP1_2. The second connection line CNL2 provided in the 1-1th sub-pixel SP1_1 and the second connection line CNL2 provided in the 1-2th sub-pixel SP1_2 may be spaced apart from each other with an imaginary line IL interposed therebetween and extending in the first direction DR1 and may be electrically disconnected and/or physically separated from each other. The second connection line CNL2 provided in the 1-1th sub-pixel SP1_1 and the second connection line CNL2 provided in the 1-2th sub-pixel SP1_2 may transmit the same alignment voltage to the second electrodes EL2 of the corresponding sub-pixels in case that light emitting elements LD are aligned in the corresponding sub-pixels.

The second connection line CNL2 provided in the 1-1th sub-pixel SP1_1 may be disposed at an upper side with respect to the imaginary line IL in the second direction DR2. The second connection line CNL2 provided in the 1-2th sub-pixel SP1_2 may be disposed at a lower side with respect to the imaginary line IL.

The second connection line CNL2 provided in the 1-1th sub-pixel SP1_1 may be electrically and/or physically connected to the second electrode EL2 of the 1-1th sub-pixel SP1_1. The second electrode EL2 of the 1-1th sub-pixel SP1_1 may diverge upward from the second connection line CNL2 provided in the corresponding sub-pixel in the second direction DR2 and thus be provided in the emission area 100 of the 1-1th sub-pixel SP1_1.

The second connection line CNL2 provided in the 1-2th sub-pixel SP1_2 may be electrically and/or physically connected to the second electrode EL2 of the corresponding sub-pixel. The second electrode EL2 of the 1-2th sub-pixel SP1_2 may include a 2-1th electrode EL2_1 and a 2-2th electrode EL2_2 which diverge downward from the second connection line CNL2 provided in the corresponding sub-pixel in the second direction DR2. The 2-1th electrode EL2_1 and the 2-2th electrode EL2_2 may be provided in the emission area 100 of the 1-2th sub-pixel SP1_2.

As illustrated in FIG. 9, two second connection lines CNL2 may be provided in the sub-pixel boundary area 300 between two sub-pixels adjacent to each other in the second direction DR2, i.e., between the 1-1th and 1-2th sub-pixels SP1_1 and SP1_2, and may be electrically and/or physically connected to the second electrodes EL2 of the corresponding sub-pixels. In this case, two first connection lines CNL1 may be provided in the sub-pixel boundary area 300 between the 2-2th sub-pixel SP2_2 and the 2-3th sub-pixel SP2_3 that are adjacent to each other in the second direction DR2, and may be electrically and/or physically connected to the first electrodes EL1 of the corresponding sub-pixels.

Figure 10:
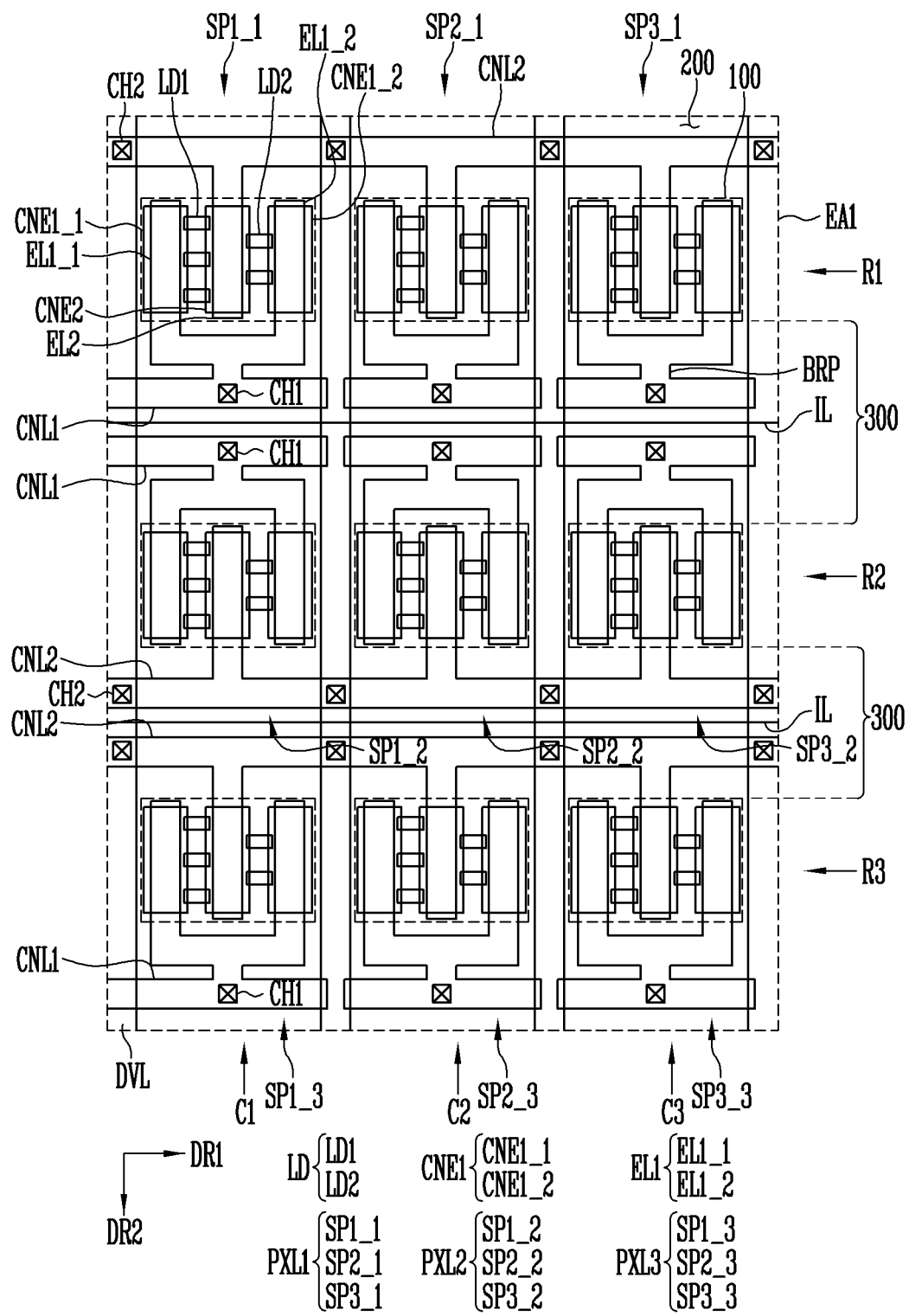
FIG. 10 illustrates a display device in accordance with an embodiment of the disclosure, and is a schematic enlarged plan view corresponding to area EA1 of FIG. 2.

FIG. 10 illustrates a display device in accordance with an embodiment of the disclosure, and is a schematic enlarged plan view corresponding to area EA1 in FIG. 2.

The configuration of the display device illustrated in FIG. 10, other than the features that each of two first connection lines provided in a sub-pixel boundary area is electrically and/or physically connected to a first electrode of a corresponding sub-pixel through a bridge pattern, may be substantially identical or similar to that of the display device of FIG. 4.

Therefore, with regard to the display device of FIG. 10, the following description will be focused on differences from that of the foregoing embodiments, to avoid repetitive explanation. Components which are not separately explained in the following description of the embodiment may comply with that of the foregoing embodiments. The same reference numeral will be used to designate the same component, and a similar reference numeral will be used to designate a similar component.

Referring to FIGS. 1A, 2, and 10, the display device in accordance with an embodiment of the disclosure may include a substrate SUB on which first to third pixels PXL1, PXL2, and PXL3 are provided. The first to third pixels PXL1, PXL2, and PXL3 may be disposed adjacent to each other in the second direction DR2 on the substrate SUB. In an embodiment, each of the first to third pixels PXL1, PXL2, and PXL3 may include at least one sub-pixel.

The first pixel PXL1 may include a 1-1th sub-pixel SP1_1, a 2-1th sub-pixel SP2_1, and a 3-1th sub-pixel SP3_1. The second pixel PXL2 may include a 1-2th sub-pixel SP1_2, a 2-2th sub-pixel SP2_2, and a 3-2th sub-pixel SP3_2. The third pixel PXL3 may include a 1-3th sub-pixel SP1_3, a 2-3th sub-pixel SP2_3, and a 3-3th sub-pixel SP3_3.

In an embodiment of the disclosure, the sub-pixel boundary area 300 is disposed in the non-emission areas 200 between two sub-pixels disposed adjacent to each other in the second direction DR2. For example, two connection lines may be provided in the sub-pixel boundary area 300 (hereinafter, referred to as "first sub-pixel boundary area") disposed between the 1-1th sub-pixel SP1_1 and the 1-2th sub-pixel SP1_2. The two connection lines may include a first connection line CNL1 (hereinafter, referred to as "1-1th connection line") provided in the 1-1th sub-pixel SP1_1, and a first connection line CNL1 (hereinafter, referred to as "1-2th connection line") provided in the 1-2th sub-pixel SP1_2.

The 1-1th connection line CNL1 and the 1-2th connection line CNL1 may be provided in the first sub-pixel boundary area 300 and be spaced apart from each other by a predetermined distance and thus electrically disconnected and/or physically separated from each other. An imaginary line IL extending in the first direction DR1 may be provided between the 1-1th connection line CNL1 and the 1-2th connection line CNL1. The 1-1th connection line CNL1 and the 1-2th connection line CNL1 may form a mirror symmetric structure with respect to the imaginary line IL. The 1-1th connection line CNL1 provided in the first sub-pixel boundary area 300 may be disposed at an upper side with respect to the imaginary line IL in the second direction DR2, and the 1-2th connection line CNL1 may be disposed at a lower side with respect to the imaginary line IL in the second direction DR2.

The 1-1th connection line CNL1 may be electrically and/or physically connected, through a bridge pattern BRP, to the first electrode EL1 disposed in the emission area 100 of the 1-1th sub-pixel SP1_1. The 1-1th connection line CNL1, the first electrode EL1, and the bridge pattern BRP may be integral with each other. The first electrode EL1 may be provided in at least a portion of the emission area 100 of the 1-1th sub-pixel SP1_1 and at least a portion of the first sub-pixel boundary area 300. The 1-1th connection line CNL1 and the bridge pattern BRP may be provided in the first sub-pixel boundary area 300.

The first electrode EL1 of the 1-1th sub-pixel SP1_1 may include a 1-1th electrode EL1_1 and a 1-2th electrode EL1_2 which diverge upward from the bridge pattern BRP provided in the first sub-pixel boundary area 300 in the second direction DR2.

The 1-2th connection line CNL1 may be electrically and/or physically connected, through a bridge pattern BRP, to the first electrode EL1 disposed in the emission area 100 of the 1-2th sub-pixel SP1_2. The 1-2th connection line CNL1, the first electrode EL1, and the bridge pattern BRP may be integral with each other. The first electrode EL1 may be provided in at least a portion of the emission area 100 of the 1-2th sub-pixel SP1_2 and at least a portion of the first sub-pixel boundary area 300. The 1-2th connection line CNL1 and the bridge pattern BRP may be provided in the first sub-pixel boundary area 300.

The first electrode EL1 of the 1-2th sub-pixel SP1_2 may diverge downward from the bridge pattern BRP provided in the first sub-pixel boundary area 300 in the second direction DR2 and may be disposed in a portion of the emission area 100 of the 1-2th sub-pixel SP1_2 and a portion of the first sub-pixel boundary area 300.

As described above, the 1-1th connection line CNL1 and the 1-2th connection line CNL1 that form a mirror symmetric structure with respect to the imaginary line IL may be disposed in the first sub-pixel boundary area 300 between the 1-1th sub-pixel SP1_1 and the 1-2th sub-pixel SP1_2 disposed adjacent to each other in the second direction DR2. Each of the 1-1th connection line CNL1 and the 1-2th connection line CNL1 that are disposed in the first sub-pixel boundary area 300 may transmit the same alignment voltage to the first electrodes EL1 of the corresponding sub-pixels in case that light emitting elements LD are aligned in the corresponding sub-pixels.

In an embodiment of the disclosure, a sub-pixel boundary area 300 (hereinafter, referred to as "second sub-pixel boundary area") may also be provided between the respective emission areas 100 of the 2-2th sub-pixel SP2_2 and the 2-3th sub-pixel SP2_3 disposed adjacent to each other in the second direction DR2. Two connection lines may be disposed in the second sub-pixel boundary area 300. The two connection lines may include a second connection line CNL2 (hereinafter, referred to as "2-1th connection line") provided in the 2-2th sub-pixel SP2_2, and a second connection line CNL2 (hereinafter, referred to as "2-2th connection line") provided in the 2-3th sub-pixel SP2_3.

The 2-1th connection line CNL2 and the 2-2th connection line CNL2 may be disposed in the second sub-pixel boundary area 300 and be spaced apart from each other by a predetermined distance and thus electrically disconnected and/or physically separated from each other. An imaginary line IL extending in the first direction DR1 may be provided between the 2-1th connection line CNL2 and the 2-2th connection line CNL2. The 2-1th connection line CNL2 and the 2-2th connection line CNL2 may form a mirror symmetric structure with respect to the imaginary line IL. The 2-1th connection line CNL2 may be disposed at an upper side with respect to the imaginary line IL in the second direction DR2, and the 2-2th connection line CNL2 may be disposed at a lower side with respect to the imaginary line IL in the second direction DR2.

The 2-1th connection line CNL2 may be electrically and/or physically connected to the second electrode EL2 disposed in the emission area 100 of the 2-2th sub-pixel SP2_2. The second electrode EL2 of the 2-2th sub-pixel SP2_2 may diverge upward from the 2-1th connection line CNL2 in the second direction DR2 and thus be provided in at least a portion of the emission area 100 of the corresponding sub-pixel and at least a portion of the second sub-pixel boundary area 300.

The 2-2th connection line CNL2 may be electrically and/or physically connected to the second electrode EL2 disposed in the emission area 100 of the 2-3th sub-pixel SP2_3. The second electrode EL2 of the 2-3th sub-pixel SP2_3 may diverge downward from the 2-2th connection line CNL2 in the second direction DR2 and thus be provided in at least a portion of the emission area 100 of the corresponding sub-pixel and at least a portion of the second sub-pixel boundary area 300.

Figure 11:
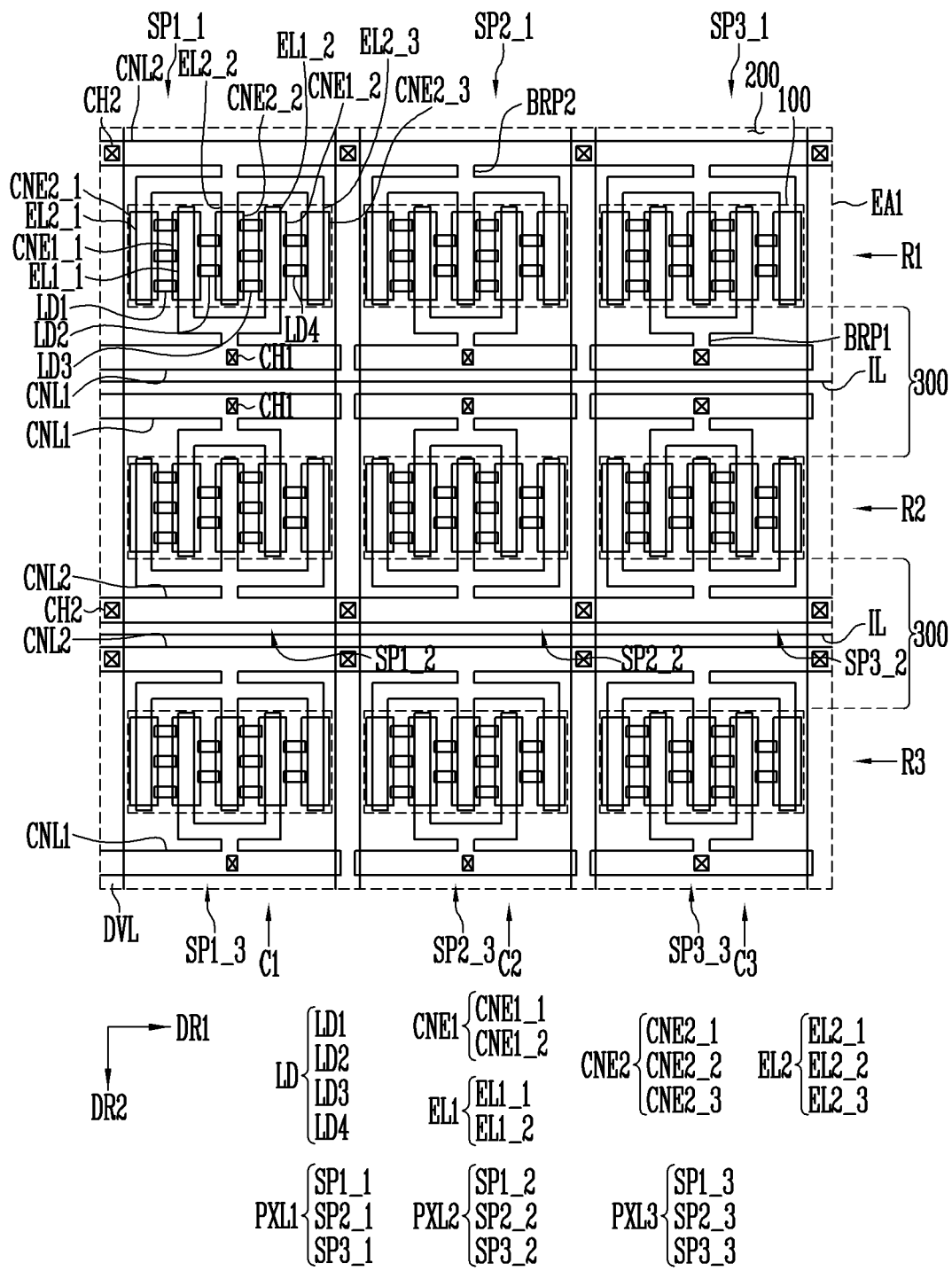
FIG. 11 illustrates a display device in accordance with an embodiment of the disclosure, and is a schematic enlarged plan view corresponding to area EA1 of FIG. 2.

FIG. 11 illustrates a display device in accordance with an embodiment of the disclosure and is a schematic enlarged plan view corresponding to area EA1 in FIG. 2.

The configuration of the display device illustrated in FIG. 11, other than the feature that a second electrode includes a 2-1th electrode, a 2-2th electrode, and a 2-3th electrode and each of first and second connection lines is integral with a bridge pattern, may be substantially identical or similar to that of the display device in FIG. 10.

Therefore, with regard to the display device in FIG. 11, the following description will be focused on differences from that of the foregoing embodiments, to avoid repetitive explanation. Components which are not separately explained in the following description of the embodiment may comply with that of the foregoing embodiments. The same reference numeral will be used to designate the same component, and a similar reference numeral will be used to designate a similar component.

Referring to FIGS. 1A, 2, and 11, the display device in accordance with an embodiment of the disclosure may include a substrate SUB on which first to third pixels PXL1, PXL2, and PXL3 are provided. The first to third pixels PXL1, PXL2, and PXL3 may be disposed adjacent to each other in the second direction DR2 on the substrate SUB. In an embodiment, each of the first to third pixels PXL1, PXL2, and PXL3 may include at least one sub-pixel.

The first pixel PXL1 may include a 1-1th sub-pixel SP1_1, a 2-1th sub-pixel SP2_1, and a 3-1th sub-pixel SP3_1. The second pixel PXL2 may include a 1-2th sub-pixel SP1_2, a 2-2th sub-pixel SP2_2, and a 3-2th sub-pixel SP3_2. The third pixel PXL3 may include a 1-3th sub-pixel SP1_3, a 2-3th sub-pixel SP2_3, and a 3-3th sub-pixel SP3_3.

In an embodiment of the disclosure, the sub-pixel boundary area 300 is disposed in the non-emission areas 200 between two sub-pixels disposed adjacent to each other in the second direction DR2. For example, two connection lines may be provided in the sub-pixel boundary area 300 (hereinafter, referred to as "first sub-pixel boundary area") disposed between the 1-1th sub-pixel SP1_1 and the 1-2th sub-pixel SP1_2. The two connection lines may include a first connection line CNL1 (hereinafter, referred to as "1-1th connection line") provided in the 1-1th sub-pixel SP1_1, and a first connection line CNL1 (hereinafter, referred to as "1-2th connection line") provided in the 1-2th sub-pixel SP1_2.

An imaginary line IL extending in the first direction DR1 may be provided between the 1-1th connection line CNL1 and the 1-2th connection line CNL1. The 1-1th connection line CNL1 and the 1-2th connection line CNL1 may form a mirror symmetric structure with respect to the imaginary line IL. The 1-1th connection line CNL1 may be disposed at an upper side with respect to the imaginary line IL in the second direction DR2, and the 1-2th connection line CNL1 may be disposed at a lower side with respect to the imaginary line IL in the second direction DR2.

In an embodiment of the disclosure, the 1-1th connection line CNL1 may be electrically and/or physically connected, through a first bridge pattern BRP1, to the first electrode EL1 provided in the emission area 100 of the 1-1th sub-pixel SP1_1. The 1-1th connection line CNL1, the first bridge pattern BRP1, and the first electrode EL1 may include the same material and may be provided on the same plane (or layer). The 1-1th connection line CNL1, the first bridge pattern BRP1, and the first electrode EL1 may be integral with each other. Here, the first electrode EL1 may include a 1-1th electrode EL1_1 and a 1-2th electrode EL1_2 which diverge upward from the first bridge pattern BRP1 in the second direction DR2.

In an embodiment of the disclosure, the 1-2th connection line CNL1 may be electrically and/or physically connected, through a first bridge pattern BRP1, to the first electrode EL1 of the 1-2th sub-pixel SP1_2. Here, the first electrode EL1 of the 1-2th sub-pixel SP1_2 may include a 1-1th electrode EL1_1 and a 1-2th electrode EL1_2 which diverge downward from the first bridge pattern BRP1 in the second direction DR2.

As described above, the 1-1th connection line CNL1 and the 1-2th connection line CNL1 may respectively transmit the same alignment voltage to the first electrodes EL1 of the corresponding sub-pixels when light emitting elements LD are aligned in the corresponding sub-pixels.

The second connection line CNL2 provided in the non-emission area 200 of the 1-1th sub-pixel SP1_1 may be electrically and/or physically connected to the second electrode EL2 of the corresponding sub-pixel through a second bridge pattern BRP2. The second connection line CNL2 electrically connected to the second electrode EL2 of the 1-1th sub-pixel SP1_1 may be disposed at an upper side of the 1-1th connection line CNL1 in the second direction DR2 in a plan view. Here, the second electrode EL2 of the 1-1th sub-pixel SP1_1 may include a 2-1th electrode EL2_1, a 2-2th electrode EL2_2, and a 2-3th electrode EL2_3 which diverge downward from the second bridge pattern BRP2 in the second direction DR2.

In the emission area 100 of the 1-1th sub-pixel SP1_1, the 2-1th electrode EL2_1 and the 2-2th electrode EL2_2 may be spaced apart from each other with the 1-1th electrode EL1_1 interposed therebetween, and the 2-2th electrode EL2_2 and the 2-3th electrode EL2_3 may be spaced apart from each other with the 1-2th electrode EL1_2 interposed therebetween. The light emitting elements LD that are aligned in the emission area 100 of the 1-1th sub-pixel SP1_1 may include first light emitting elements LD1 aligned between the 2-1th electrode EL2_1 and the 1-1th electrode EL1_1, second light emitting elements LD2 aligned between the 1-1th electrode EL1_1 and the 2-2th electrode EL2_2, third light emitting elements LD3 aligned between the 2-2th electrode EL2_2 and the 1-2th electrode EL1_2, and fourth light emitting elements LD4 aligned between the 1-2th electrode EL1_2 and the 2-3th electrode EL2_3.

The second connection line CNL2 provided in the non-emission area 200 of the 1-2th sub-pixel SP1_2 may be electrically and/or physically connected to the second electrode EL2 of the corresponding sub-pixel through a second bridge pattern BRP2. The second connection line CNL2 electrically connected to the second electrode EL2 of the 1-2th sub-pixel SP1_2 may be disposed at a lower side of the 1-1th connection line CNL1 in the second direction DR2 in a plan view. Here, the second electrode EL2 of the 1-2th sub-pixel SP1_2 may include a 2-1th electrode EL2_1, a 2-2th electrode EL2_2, and a 2-3th electrode EL2_3 which diverge upward from the second bridge pattern BRP2 in the second direction DR2.

In the emission area 100 of the 1-2th sub-pixel SP1_2, the 2-1th electrode EL2_1 and the 2-2th electrode EL2_2 may be spaced apart from each other with the 1-1th electrode EL1_1 interposed therebetween, and the 2-2th electrode EL2_2 and the 2-3th electrode EL2_3 may be spaced apart from each other with the 1-2th electrode EL1_2 interposed therebetween. The light emitting elements LD that are aligned in the emission area 100 of the 1-2th sub-pixel SP1_2 may include first to fourth light emitting elements LD1, LD2, LD3, and LD4.

In an embodiment of the disclosure, a sub-pixel boundary area 300 (hereinafter, referred to as "second sub-pixel boundary area") may be provided between the 2-2th sub-pixel SP2_2 and the 2-3th sub-pixel SP2_3 disposed adjacent to each other in the second direction DR2. Two connection lines may be provided in the second sub-pixel boundary area 300. The two connection lines may include a second connection line CNL2 (hereinafter, referred to as "2-1th connection line") provided in the 2-2th sub-pixel SP2_2, and a second connection line CNL2 (hereinafter, referred to as "2-2th connection line") provided in the 2-3th sub-pixel SP2_3.

An imaginary line IL extending in the first direction DR1 may be provided between the 2-1th connection line CNL2 and the 2-2th connection line CNL2. The 2-1th connection line CNL2 and the 2-2th connection line CNL2 may form a mirror symmetric structure with respect to the imaginary line IL. The 2-1th connection line CNL2 may be disposed at an upper side with respect to the imaginary line IL in the second direction DR2, and the 2-2th connection line CNL2 may be disposed at a lower side with respect to the imaginary line IL in the second direction DR2.

The 2-1th connection line CNL2 may be electrically and/or physically connected to the second electrode EL2 of the 2-2th sub-pixel SP2_2 through a second bridge pattern BRP2. The second electrode EL2 of the 2-2th sub-pixel SP2_2 may diverge upward from the second bridge pattern BRP2 in the second direction DR2 and thus be provided in the emission area 100 of the corresponding sub-pixel. The second electrode EL2 of the 2-2th sub-pixel SP2_2 may include a 2-1th electrode EL2_1, a 2-2th electrode EL2_2, and a 2-3th electrode EL2_3. The first electrode EL1 of the 2-2th sub-pixel SP2_2 may include a 1-1th electrode EL1_1 and a 1-2th electrode EL1_2. The first electrode EL1 and the second electrode EL2 of the 2-2th sub-pixel SP2_2 may be spaced apart from each other by a predetermined distance and may be provided in the emission area 100 of the corresponding sub-pixel.

The 2-2th connection line CNL2 may be electrically and/or physically connected to the second electrode EL2 of the 2-3th sub-pixel SP2_3 through a second bridge pattern BRP2. The second electrode EL2 of the 2-3th sub-pixel SP2_3 may diverge downward from the second bridge pattern BRP2 in the second direction DR2 and thus be provided in the emission area 100 of the corresponding sub-pixel. The second electrode EL2 of the 2-3th sub-pixel SP2_3 may include a 2-1th electrode EL2_1, a 2-2th electrode EL2_2, and a 2-3th electrode EL2_3. The first electrode EL1 of the 2-3th sub-pixel SP2_3 may include a 1-1th electrode EL1_1 and a 1-2th electrode EL1_2. The first electrode EL1 and the second electrode EL2 of the 2-3th sub-pixel SP2_3 may be spaced apart from each other by a predetermined distance and may be provided in the emission area 100 of the corresponding sub-pixel.

Each of the 2-1th connection line CNL2 and the 2-2th connection line CNL2 that are disposed in the second sub-pixel boundary area 300 may transmit the same alignment voltage to the second electrodes EL2 of the corresponding sub-pixels in case that light emitting elements LD are aligned in the corresponding sub-pixels.

Figure 12:
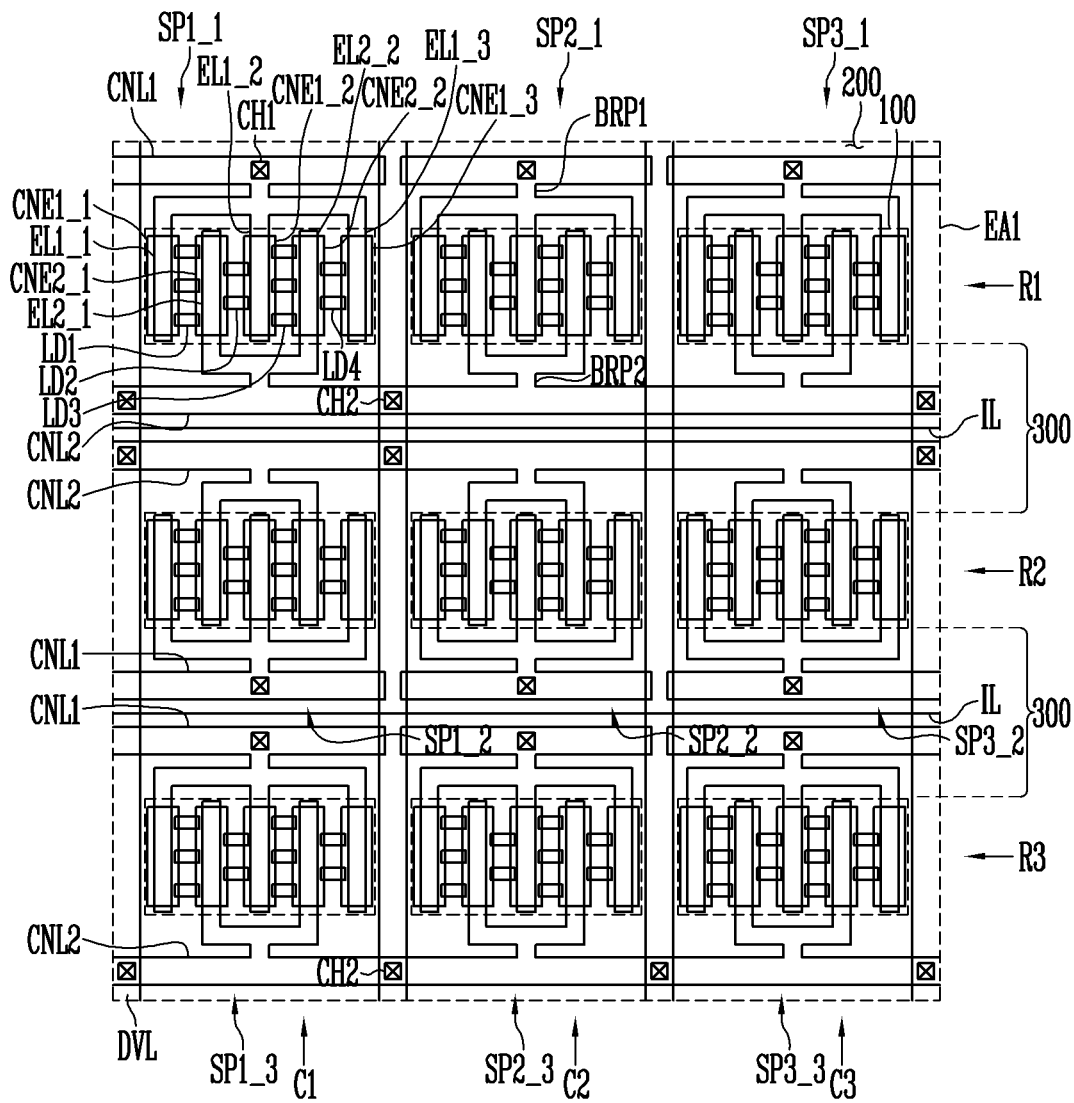
FIG. 12 illustrates a display device in accordance with an embodiment of the disclosure, and is a schematic enlarged plan view corresponding to area EA1 of FIG. 2.

FIG. 12 illustrates a display device in accordance with an embodiment of the present disclosure, and is a schematic enlarged plan view corresponding to area EA1 in FIG. 2.

The configuration of the display device illustrated in FIG. 12, other than the features that a first electrode connected to a first connection line includes a 1-1th electrode, a 1-2th electrode, and a 1-3th electrode, and a second electrode connected to a second connection line includes a 2-1th electrode and a 2-2th electrode, may be substantially identical or similar to that of the display device in FIG. 11.

Referring to FIGS. 1A, 2, and 12, the display device in accordance with an embodiment of the disclosure may include a substrate SUB on which first to third pixels PXL1, PXL2, and PXL3 are provided. The first to third pixels PXL1, PXL2, and PXL3 may be disposed adjacent to each other in the second direction DR2 on the substrate SUB. In an embodiment, each of the first to third pixels PXL1, PXL2, and PXL3 may include at least one sub-pixel.

The first pixel PXL1 may include a 1-1th sub-pixel SP1_1, a 2-1th sub-pixel SP2_1, and a 3-1th sub-pixel SP3_1. The second pixel PXL2 may include a 1-2th sub-pixel SP1_2, a 2-2th sub-pixel SP2_2, and a 3-2th sub-pixel SP3_2. The third pixel PXL3 may include a 1-3th sub-pixel SP1_3, a 2-3th sub-pixel SP2_3, and a 3-3th sub-pixel SP3_3.

In an embodiment of the disclosure, the sub-pixel boundary area 300 is disposed in the non-emission areas 200 between two sub-pixels disposed adjacent to each other in the second direction DR2. For example, two connection lines may be provided in the sub-pixel boundary area 300 (hereinafter, referred to as "first sub-pixel boundary area") disposed between the 1-1th sub-pixel SP1_1 and the 1-2th sub-pixel SP1_2. The two connection lines may include a second connection line CNL2 (hereinafter, referred to as "2-1th connection line") provided in the 1-1th sub-pixel SP1_1, and a second connection line CNL2 (hereinafter, referred to as "2-2th connection line") provided in the 1-2th sub-pixel SP1_2.

An imaginary line IL extending in the first direction DR1 may be provided between the 2-1th connection line CNL2 and the 2-2th connection line CNL2. The 2-1th connection line CNL2 and the 2-2th connection line CNL2 may form a mirror symmetric structure with respect to the imaginary line IL. The 2-1th connection line CNL2 may be disposed at an upper side with respect to the imaginary line IL in the second direction DR2, and the 2-2th connection line CNL2 may be disposed at a lower side with respect to the imaginary line IL in the second direction DR2.

In an embodiment of the disclosure, the 2-1th connection line CNL2 may be electrically and/or physically connected, through a second bridge pattern BRP2, to the second electrode EL2 of the 1-1th sub-pixel SP1_1. The 2-1th connection line CNL2, the second bridge pattern BRP2, and the second electrode EL2 may include the same material and may be provided on the same plane (or layer). The 2-1th connection line CNL2, the second bridge pattern BRP2, and the second electrode EL2 may be integral with each other. Here, the second electrode EL2 may include a 2-1th electrode EL2_1 and a 2-2th electrode EL2_2 which diverge upward from the second bridge pattern BRP2 in the second direction DR2.

In an embodiment of the disclosure, the 2-2th connection line CNL2 may be electrically and/or physically connected, through a second bridge pattern BRP2, to the second electrode EL2 of the 1-2th sub-pixel SP1_2. Here, the second electrode EL2 of the 1-2th sub-pixel SP1_2 may include a 2-1th electrode EL2_1 and a 2-2th electrode EL2_2 which diverge downward from the second bridge pattern BRP2 in the second direction DR2.

As described above, each of the 2-1th connection line CNL2 and the 2-2th connection line CNL2 that are disposed in the first sub-pixel boundary area 300 may transmit the same alignment voltage to the second electrodes EL2 of the corresponding sub-pixels in case that light emitting elements LD are aligned in the corresponding sub-pixels.

The first connection line CNL1 provided in the non-emission area 200 of the 1-1th sub-pixel SP1_1 may be electrically and/or physically connected to the first electrode EL1 of the corresponding sub-pixel through a first bridge pattern BRP1. Here, the first electrode EL1 of the 1-1th sub-pixel SP1_1 may include a 1-1th electrode EL1_1, a 1-2th electrode EL1_2, and a 1-3th electrode EL1_3 which diverge downward from the first bridge pattern BRP1 in the second direction DR2. The first electrode EL1 and the second electrode EL2 of the 1-1th sub-pixel SP1_1 may be spaced apart from each other by a predetermined distance and may be provided in the emission area 100 of the corresponding sub-pixel.

The first connection line CNL1 provided in the non-emission area 200 of the 1-2th sub-pixel SP1_2 may be electrically and/or physically connected to the first electrode EL1 of the corresponding sub-pixel through a first bridge pattern BRP1. Here, the first electrode EL1 of the 1-2th sub-pixel SP1_2 may include a 1-1th electrode EL1_1, a 1-2th electrode EL1_2, and a 1-3th electrode EL1_3 which diverge upward from the first bridge pattern BRP1 in the second direction DR2. The first electrode EL1 and the second electrode EL2 of the 1-2th sub-pixel SP1_2 may be spaced apart from each other by a predetermined distance and may be provided in the emission area 100 of the corresponding sub-pixel.

In an embodiment of the disclosure, a sub-pixel boundary area 300 (hereinafter, referred to as "second sub-pixel boundary area") may be provided between the 2-2th sub-pixel SP2_2 and the 2-3th sub-pixel SP2_3 disposed adjacent to each other in the second direction DR2. Two connection lines may be provided in the second sub-pixel boundary area 300. The two connection lines may include a first connection line CNL1 (hereinafter, referred to as "1-1th connection line") provided in the 2-2th sub-pixel SP2_2, and a first connection line CNL1 (hereinafter, referred to as "1-2th connection line") provided in the 2-3th sub-pixel SP2_3.

An imaginary line IL extending in the first direction DR1 may be provided between the 1-1th connection line CNL1 and the 1-2th connection line CNL1. The 1-1th connection line CNL1 and the 1-2th connection line CNL1 may form a mirror symmetric structure with respect to the imaginary line IL. The 1-1th connection line CNL1 and the 1-2th connection line CNL1 may respectively transmit the same alignment voltage to the first electrodes EL1 of the corresponding sub-pixels in case that light emitting elements LD are aligned in the corresponding sub-pixels.

The 1-1th connection line CNL1 may be electrically and/or physically connected to the first electrode EL1 of the 2-2th sub-pixel SP2_2 through a first bridge pattern BRP1. The first electrode EL1 of the 2-2th sub-pixel SP2_2 may diverge upward from the first bridge pattern BRP1 in the second direction DR2 and thus be provided in the emission area 100 of the corresponding sub-pixel. The first electrode EL1 of the 2-2th sub-pixel SP2_2 may include a 1-1th electrode EL1_1, a 1-2th electrode EL1_2, and a 1-3th electrode EL1_3. The second electrode EL2 of the 2-2th sub-pixel SP2_2 may include a 2-1th electrode EL2_1 and a 2-2th electrode EL2_2. The first electrode EL1 and the second electrode EL2 of the 2-2th sub-pixel SP2_2 may be spaced apart from each other by a predetermined distance and may be provided in the emission area 100 of the corresponding sub-pixel.

The 1-2th connection line CNL1 may be electrically and/or physically connected to the first electrode EL1 of the 2-3th sub-pixel SP2_3 through a first bridge pattern BRP1. The first electrode EL1 of the 2-3th sub-pixel SP2_3 may diverge downward from the first bridge pattern BRP1 in the second direction DR2 and thus be provided in the corresponding sub-pixel. The first electrode EL1 of the 2-3th sub-pixel SP2_3 may include a 1-1th electrode EL1_1, a 1-2th electrode EL1_2, and a 1-3th electrode EL1_3. The second electrode EL2 of the 2-3th sub-pixel SP2_3 may include a 2-1th electrode EL2_1 and a 2-2th electrode EL2_2. The first electrode EL1 and the second electrode EL2 of the 2-3th sub-pixel SP2_3 may be spaced apart from each other by a predetermined distance and may be provided in the emission area 100 of the corresponding sub-pixel.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure. The scope of the claimed invention must be defined by the accompanying claims.

What is claimed is:

1. A display device comprising:
a substrate including a display area and a non-display area; and
a plurality of pixels provided on the display area, each comprising a plurality of sub-pixels each including an emission area and a non-emission area, wherein
each of the sub-pixels comprises a display element layer including at least one light emitting element that emits light,
the display element layer comprises:
a first electrode and a second electrode spaced apart from each other with the light emitting element being disposed between the first and second electrodes; and
a connection line comprising a first connection line extending in a row direction of the substrate and electrically connected to the first electrode, and a second connection line extending parallel the first connection line and electrically connected to the second electrode, the second connection line electrically separate from the first connection line, and
wherein two connection lines having a symmetric structure are disposed in a common area between two sub-pixels immediately adjacent to each other in a column direction of the substrate.

2. The display device according to claim 1, wherein
the area between the two sub-pixels is the non-emission area, and
the two connection lines form a mirror symmetric structure with respect to an imaginary line extending in the row direction in the area between the two sub-pixels.

3. The display device according to claim 2, wherein the two connection lines comprise:
the first connection line provided in one the two sub-pixels and connected to the first electrode of the one of the two sub-pixels; and
the first connection line provided in the other of the two sub-pixels and connected to the first electrode of the other of the two sub-pixels.

4. The display device according to claim 3, wherein
the second electrode of each of the two sub-pixels comprises a 2-1th electrode and a 2-2th electrode that diverge from the second connection line of corresponding one or the two sub-pixels into the emission area of the corresponding one or the two sub-pixels,
the 2-1th electrode and the 2-2th electrode are spaced apart from each other, and
the first electrode of the corresponding one of the two sub-pixels is disposed between the 2-1th electrode and the 2-2th electrode.

5. The display device according to claim 3, wherein
the first electrode of each of the two sub-pixels comprises a 1-1th electrode and a 1-2th electrode that diverge from the first connection line of corresponding one of the two sub-pixels into the emission area of the corresponding one of the two sub-pixels,
the 1-1th electrode and the 1-2th electrode are spaced apart from each other, and
the second electrode of the corresponding one of the two sub-pixels is disposed between the 1-1th electrode and the 1-2th electrode.

6. The display device according to claim 5, wherein
the second connection line of the one sub-pixel of the two sub-pixels is disposed at an upper side of the first connection line in the column direction in the one of the two sub-pixels, and
the second connection line of the other of the two sub-pixels is disposed at a lower side of the first connection line in the column direction in the one of the two sub-pixels.

7. The display device according to claim 6, wherein the second connection line of each of the two sub-pixels are spaced apart from each other, and
the emission area of each of the two sub-pixels is disposed between the second connection line of each of the two sub-pixels in the column direction.

8. The display device according to claim 7, wherein
the second electrode of each of the two sub-pixels comprises a 2-1th electrode, a 2-2th electrode, and a 2-3th electrode that diverge from the second connection line of the one of the two sub-pixels into the emission area of the one of the two sub-pixels,
the 2-1th electrode and the 2-2th electrode are spaced apart from each other,
the 1-1th electrode is disposed between the 2-1th electrode and the 2-2th electrode,
the 2-2th electrode and the 2-3th electrode are spaced apart from each other,
the 1-2th electrode is disposed between the 2-2th electrode and the 2-3th electrode.

9. The display device according to claim 2, wherein the two connection lines comprise:
the second connection line provided in one of the two sub-pixels and connected to the second electrode of the one of the two sub-pixels; and
the second connection line provided in the other of the two sub-pixels, and connected to the second electrode of the other of the two sub-pixels.

10. The display device according to claim 9, wherein
the first electrode of each of the two sub-pixels comprises a 1-1th electrode and a 1-2th electrode that diverge from the first connection line of corresponding one of the two sub-pixels into the emission area of the corresponding sone of the two sub-pixels,
the 1-1th electrode and the 1-2th electrode are spaced apart from each other, and
the second electrode of the corresponding one of the two sub-pixels is disposed between the 1-1th electrode and the 1-2th electrode.

11. The display device according to claim 9, wherein
the second electrode of each of the two sub-pixels comprises a 2-1th electrode and a 2-2th electrode that diverge from the second connection line of corresponding one of the two sub-pixels into the emission area of the corresponding one of the two sub-pixels,
the 2-1th electrode and the 2-2th electrode are spaced apart from each other, and
the first electrode of the corresponding one of the two sub-pixels is disposed between the 2-1th electrode and the 2-2th electrode.

12. The display device according to claim 11, wherein
the first connection line of one of the two sub-pixels is disposed above the second connection line in the column direction in the one of the two sub-pixels, and
the first connection line of the other of the two sub-pixels is disposed below the second connection line in the column direction in the other of the two sub-pixels.

13. The display device according to claim 12, wherein
the first connection line of each of the two sub-pixels are spaced apart from each other, and
the emission area of each of the two sub-pixels is disposed between the first connection line of each of the two sub-pixels in the column direction.

14. The display device according to claim 13, wherein
the first electrode of each of the two sub-pixels comprises a 1-1th electrode, a 1-2th electrode, and a 1-3th electrode that diverge from the first connection line of corresponding one of the two sub-pixels into the emission area of the corresponding one of the two sub-pixels, and
the 1-1th electrode and the 1-2th electrode are spaced apart from each other,
the 2-1th electrode is disposed between the 1-1th electrode and the 1-2th electrode,
the 1-2th electrode and the 1-3th electrode are spaced apart from each other,
the 2-2th electrode is disposed between the 1-2th electrode and the 1-3th electrode.

15. The display device according to claim 2, wherein the display element layer comprises:
a first contact electrode that connects the first electrode with one end of opposite ends of the light emitting element; and
a second contact electrode that connects the second electrode with another end of the light emitting element.

16. The display device according to claim 15, wherein each of the sub-pixels further comprises a pixel circuit layer including at least one transistor electrically connected to the light emitting element.

17. A method of fabricating a display device, comprising:
providing a substrate comprising a plurality of sub-pixels each including an emission area and a non-emission area; and
forming, on the substrate, a display element layer that emits light from the emission area of each of the sub-pixels, wherein
the forming of the display element layer comprises:
forming a first electrode and a second electrode spaced apart from each other in the emission area,
simultaneously, forming, in the non-emission area, a first metal layer connected to the first electrode and extending in a direction, and a second metal layer connected to the second electrode and extending parallel to the first metal layer;
forming an electric field between the first electrode and the second electrode by applying different alignment voltages to the first metal layer and the second metal layer, and then aligning a plurality of light emitting elements between the first electrode and the second electrode;
forming, on the substrate including the light emitting elements, a connection line by removing a portion of one of the first and the second metal layers, the connection line including a first connection line connected to the first electrode and a second connection line connected to the second electrode;
forming a first contact electrode that electrically connects the first electrode with one end of opposite ends of each of the light emitting elements; and
forming a second contact electrode that electrically connects the second electrode with another end of the opposite ends of each of the light emitting elements,
the aligning of the plurality of light emitting elements comprises disposing two metal layers formed on a same layer and to which an identical alignment voltage is to be applied in an area between two sub-pixels disposed adjacent to each other in a column direction of the substrate.

18. The method according to claim 17, wherein
the area between the two sub-pixels is the non-emission area,
the method further comprises after the aligning of the light emitting elements, disposing two connection lines having a mirror symmetric structure with respect to an imaginary line extending in a row direction intersecting the column direction in the area between the two sub-pixels.

19. The method according to claim 18, wherein the two metal layers to which the identical alignment voltage is to be applied comprises:
the first metal layer provided in one of the two sub-pixels and connected to the first electrode of the one of the two sub-pixels; and
the first metal layer provided in the other of the two sub-pixels and connected to the first electrode of the other of the two sub-pixels.

20. The method according to claim 18, wherein the two metal layers to which the identical alignment voltage is to be applied comprises:
the second metal layer in one of the two sub-pixels and connected to the second electrode of the one of the two sub-pixels; and
the second metal layer provided in the other of the two sub-pixels and connected to the second electrode of the other of the two sub-pixels.

* * * * *